United States Patent
Kobayashi et al.

(10) Patent No.: US 7,195,845 B2
(45) Date of Patent: Mar. 27, 2007

(54) SPIN-COATING METHOD, DETERMINATION METHOD FOR SPIN-COATING CONDITION AND MASK BLANK

(75) Inventors: Hideo Kobayashi, Tokyo (JP); Takao Higuchi, Tokyo (JP)

(73) Assignee: Hoya Corporation, Tokyo (JP)

( * ) Notice: Subject to any disclaimer, the term of this patent is extended or adjusted under 35 U.S.C. 154(b) by 378 days.

(21) Appl. No.: 10/405,505

(22) Filed: Apr. 3, 2003

(65) Prior Publication Data
US 2004/0009295 A1 Jan. 15, 2004

(30) Foreign Application Priority Data
Apr. 3, 2002 (JP) ............................. 2002-101840

(51) Int. Cl.
*G03F 1/00* (2006.01)
*G03F 9/00* (2006.01)

(52) U.S. Cl. .......................................................... 430/5
(58) Field of Classification Search ..................... 430/5
See application file for complete search history.

(56) References Cited

U.S. PATENT DOCUMENTS 6,162,565 A * 12/2000 Chao et al. .................. 430/5

6,635,393 B2 * 10/2003 Pierrat ........................... 430/5
6,855,463 B2 * 2/2005 Lassiter et al. ............... 430/5

FOREIGN PATENT DOCUMENTS

JP 4-29215 5/1992

* cited by examiner

*Primary Examiner*—S. Rosasco
(74) *Attorney, Agent, or Firm*—Sughrue Mion, PLLC

(57) ABSTRACT

A spin-coating method according to the present invention includes a uniforming step of rotating a substrate at a predetermined main rotation speed for a predetermined main rotation time so as to primarily make a resist film thickness uniform, and a subsequent drying step of rotating the substrate at a predetermined drying rotation speed for a predetermined drying rotation time so as to primarily dry the uniform resist film. In the present invention, a contour map, for example, of film thickness uniformity within an effective region (critical area) shown in FIG. 3A is determined (generated), and resist-coating is performed by selecting a condition within the optimum region in this contour map in which the film thickness uniformity (within an effective region) can be the maximum, or within the region in which the film thickness uniformity (within an effective region) can be high enough for a desirably specified.

20 Claims, 15 Drawing Sheets

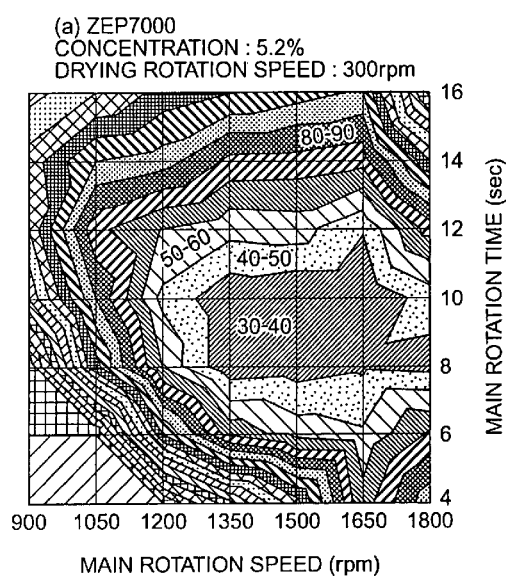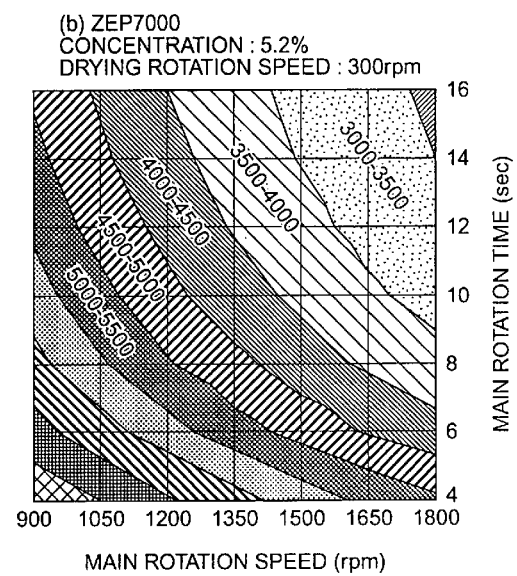
FIG. 3A
FIG. 3B

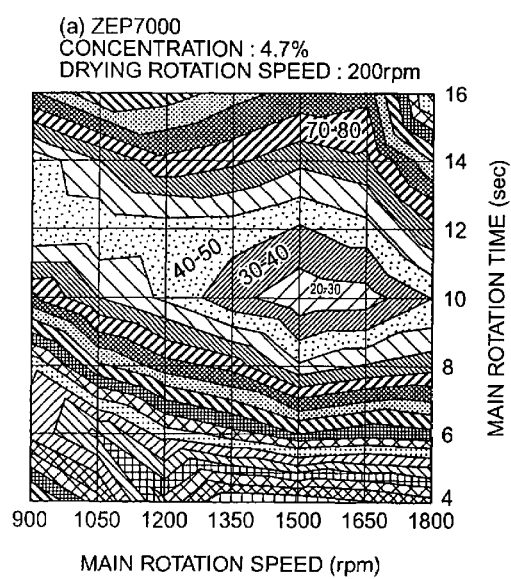
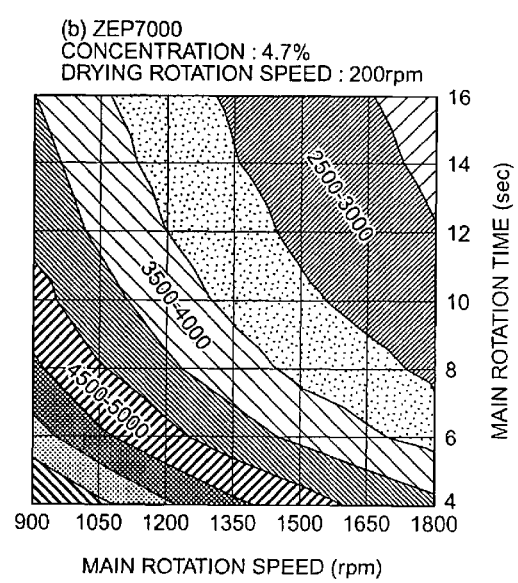
FIG. 7A
FIG. 7B

SPIN-COATING METHOD, DETERMINATION METHOD FOR SPIN-COATING CONDITION AND MASK BLANK

This application claims priority to prior application JP 2002-101840, the disclosure of which is incorporated herein by reference.

BACKGROUND OF THE INVENTION

1. Field of the Invention

The present invention relates to a spin-coating method for spin-coating a substrate surface in the shape of a square or the like with a resist film, a resist bottom anti-reflective coating (BARC), a resist top anti-reflective layer (TARL), a resist top protective film, a conductive film or the like (hereafter may be collectively referred to as a resist film) by a specific method. In particular, the present invention relates to a determination method for a resist spin-coating condition in order to make the coating thickness of the resist film further uniform, and a resist spin-coating method, as well as a photomask blank, etc., including a resist film, a resist bottom anti-reflective coating, a resist top anti-reflective layer, a resist top protective film, a conductive film or the like, or a combination thereof, formed by this method.

2. Description of the Related Art

In spin coating of resist solution, a commonly used spin-coating device has a basic configuration shown in FIG. 1. In FIG. 1, the spin-coating device comprises a nozzle 1 for supplying resist solution, a chuck 2 for chucking a substrate 3 and attached onto a cup 4, and a motor 5 for rotating the chuck 2 together with the substrate 3. As an example of the spin-coating method using such a spin-coating device, the following resist-coating method has been proposed (Japanese Patent Publication No. 4-29215). This resist-coating method aims to make the coating film thickness uniform, especially regarding a square-like (square or rectangular) substrate. This resist-coating method is composed of a uniforming (evening or flatting) step and a subsequent drying step. In the uniforming step, a substrate is rotated by selecting a setting rotation speed corresponding to a desirably specified film thickness, a predetermined rotation time and a product of the setting rotation speed and the predetermined rotation time. In the drying step, the square-like (square or rectangular) substrate is rotated at the rotation speed lower than the setting rotation speed in the uniforming step, and thereby, the resist film is dried.

Regarding the above mentioned resist-coating method, in consideration of the film thickness and the concentration (viscosity) of the resist solution, a setting value R of the rotation speed of the square-like (square or rectangular) substrate is specified to be a predetermined value (desirably 250 to 2,000 rpm) within the range of 100 to 6,000 rpm in the uniforming step, a rotation time T is specified to be 20 seconds or less after the rotation speed has reached the setting value R (the predetermined value), and the product (R×T) of the setting value R of the rotation speed and the rotation time T is specified to be 24,000 (rpm×sec) or less. The rotation speed is experimentally specified to be 130 rpm or less in the drying step following the uniforming step. Furthermore, the vapor pressure (at 20° C.) of a solvent is specified to be 20 mmHg or less, while the solvent adjusts the viscosity of the resist solution. By satisfying these conditions, protuberance (fringe: one or various light or dark bands produced by the interference of light due to the resist film thickness variation) of the resist film can be reduced outside the inscribed circle of the square-like (square or rectangular) substrate, and the region of uniform film thickness can be expanded by reduction of this fringe.

However, the above mentioned resist-coating method merely limits the range of the combination (rotation condition) of the rotation speed and the rotation time in the uniforming step to the range inside the curve Ca (the range diagonally shaded with solid lines) in FIG. 2, or merely limits to the desirable range diagonally shaded with broken lines. Consequently, the above mentioned resist-coating method does not propose a technique for selecting the rotation condition to achieve maximum (the best) film thickness uniformity within an effective region (critical area) under the condition practically required in the above mentioned field of application, that is, with respect to a predetermined resist species, a desirably specified film thickness and a desirably specified effective region.

The above mentioned resist-coating method merely specifies an upper limit with respect to selection of the rotation speed in the drying step as well. Therefore, the above mentioned resist-coating method does not propose a technique for selecting the rotation condition to achieve maximum (the best) film thickness uniformity within an effective region nor a technique for optimizing the drying rotation speed.

Furthermore, the above mentioned resist-coating method merely specifies an upper limit of the vapor pressure of the solvent with respect to a method for adjusting the concentration (viscosity) of the resist solution, and therefore, does not propose a technique for optimizing the concentration of the resist solution.

For the reasons described above, conventionally, resist-coating conditions were determined by trial and error within the range of the values of the above mentioned resist-coating method, and therefore, much time was required for achieving desirably specified film thickness uniformity within an effective region.

In the conventional methods, a relative evaluation was able to be performed between individual coating conditions with respect to the film thickness uniformity within an effective region. However, it was not possible to judge whether the determined condition (the rotation speed and the rotation time) is a limit value for the film thickness uniformity within an effective region (that is, the optimum coating condition for achieving maximum film thickness uniformity within an effective region). That is, conventional methods were not able to perform an absolute evaluation of the film thickness uniformity within an effective region.

The resist concentration may significantly fluctuates relative to a specification value or a target value due to variations in the manufacture (variations in quality) of a resist solution (a coating solution) or variations in dilution for adjusting a viscosity. When the resist solution is applied while the resist concentration significantly fluctuates, desirably specified film thickness uniformity within an effective region cannot be achieved.

Regarding some resist species, the film thickness uniformity within an effective region is highly sensitive to the coating condition (the rotation speed and the rotation time) and the coating environment (ambient temperature and humidity), and therefore, desirably specified film thickness uniformity within an effective region cannot be achieved when these coating conditions fluctuate relative to the setting values due to coating device factors and environmental factors.

Regarding some resist species, in order to achieve desirably specified film thickness uniformity within an effective region in a wide range of, for example, 3,000 to 5,000 angstroms or 3,000 to 4,000 angstroms, conventional methods took much time because a coating condition was independently determined with respect to each resist film thickness. In addition, many resist solutions having different concentrations (viscosities) had to be prepared, and a specific facility (a resist solution dispensing device including a filtration mechanism for the solution) was required for each solution.

SUMMARY OF THE INVENTION

The present invention was made to overcome the above mentioned problems. The present invention relates to a spin-coating method for applying resist solution or other coating solution by a specific spin-coating method described above.

It is a major objective of the present invention to provide a technique for optimizing a main rotation condition, a technique for optimizing a drying rotation condition and a technique for optimizing a concentration (viscosity) condition of resist solution or other coating solution, and to establish a technique for reliably (univocally) determining these optimum conditions without depending on trial-and-error methods.

It is another objective of the present invention to provide a technique capable of speedily, univocally determining the optimum spin-coating condition without depending on trial-and-error methods, even when a resist species or other coating solution is changed, a desirably specified effective region (critical area) is changed, a desirably specified film thickness is changed, and a spin-coating device (for example, the shape of a cup and the shape of a chuck) is changed.

It is another objective of the present invention to provide a determination method for a resist spin-coating condition capable of reliably (univocally) achieving desirably specified film thickness uniformity within an effective region (in particular, maximum film thickness uniformity within an effective region) in a desirably specified effective region without depending on trial-and-error methods regarding a predetermined resist species or other coating solution, and a spin-coating method, as well as a mask blank (photomask blank) or a substrate including a resist film, other film or the like, or a combination thereof, formed by this method.

It is another objective of the present invention to provide a determination method for a spin-coating condition capable of reliably (univocally) achieving a desirably specified film thickness (mean) and desirably specified film thickness uniformity within an effective region in a desirably specified effective region without depending on trial-and-error methods regarding a predetermined resist species or other coating solution, and a spin-coating method, as well as a mask blank (photomask blank) or a substrate including a resist film, other film or the like, or a combination thereof, formed by this method.

It is another objective of the present invention to provide a determination method for a spin-coating condition capable of reliably achieving an optimum spin-coating condition in accordance with the characteristics of a resist species or other coating solution without depending on trial-and-error methods, and a spin-coating method, as well as a mask blank (photomask blank) or a substrate including a resist film, other film or the like, or a combination thereof, formed by this method.

It is another objective of the present invention to provide a spin-coating method capable of applying resist solution having one concentration or other coating solution having one concentration in such a manner that plural sorts of resist film thickness or plural sorts of coating film thickness can be achieved while the film thickness uniformity within an effective region is within a predetermined range.

In order to achieve the above mentioned objectives, the present invention can include various aspects described below.

The present invention is applied to a spin-coating method including a uniforming (evening or flatting) step of dispensing resist solution on a substrate and rotating the substrate at a predetermined main rotation speed for a predetermined main rotation time, so as to primarily make the resist film thickness uniform, and a drying step of rotating the substrate at a predetermined drying rotation speed for a predetermined drying rotation time after the uniforming step, so as to primarily dry the uniform resist film.

First Aspect

In the first aspect of the present invention, a plurality of samples are prepared by being coated with the resist solution under a plurality of conditions resulting from independent, stepwise change in parameters in the uniforming step, while the parameters are the main rotation speed and the main rotation time, and under the condition in which the concentration (viscosity) of the resist solution is fixed at an arbitrary concentration, and the drying rotation speed in the drying step is fixed at an arbitrary rotation speed. The resist film thicknesses of each sample are measured at a plurality of points within a desirably specified effective region (critical area) in the substrate, and film thickness uniformity within an effective region is determined from results of film thickness distribution [range (maximum minus minimum) value or standard deviation value], within the effective region (critical area) of the measurment. The relationship is thereby determined between the condition of combination of the main rotation speed and the main rotation time of each sample and the film thickness uniformity within an effective region of each sample, and this relationship is specified to be reference data A. A condition I of combination of the main rotation speed and the main rotation time for achieving desirably specified film thickness uniformity within an effective region is determined based on the reference data A, and resist-coating is performed in accordance with results of the condition I of combination of the main rotation speed and the main rotation time.

Second Aspect

In the second aspect of the present invention, the reference data A is a contour map in which the vertical axis indicates the main rotation speed, the horizontal axis indicates the main rotation time, and points corresponding to the same film thickness uniformity within the effective region are bonded by a contour line, or a bird's eye view drawn by point-plotting while the X axis, the Y axis and the Z axis indicate the main rotation speed, the main rotation time and the film thickness uniformity within the effective region, respectively.

Third Aspect

In the third aspect of the present invention, a plurality of reference data A according to the above mentioned first aspect or contour maps or bird's eye views according to the above mentioned second aspect are determined based on stepwise change in the concentration (viscosity) of the resist solution. A condition II of concentration (viscosity) of the resist solution for achieving maximum (the best) film thickness uniformity within the effective region is determined among the group consisting of the plural reference data A, the group consisting of the plural contour maps or the group consisting of the plural bird's eye views, and resist-coating is performed in accordance with results of condition II of concentration (viscosity) of the resist solution.

Fourth Aspect

In the fourth aspect of the present invention, a plurality of reference data A according to the above mentioned first aspect or contour maps or bird's eye views according to the above mentioned second aspect are determined based on stepwise change in the drying rotation speed in the drying step while the concentration (viscosity) of the resist solution is fixed at an arbitrary concentration. A condition III of drying rotation speed for achieving maximum film thickness uniformity within the effective region is determined among the group consisting of results of plural reference data A, the group consisting of results of plural contour maps or the group consisting of results of plural bird's eye views, and resist-coating is performed in accordance with results of condition III of drying rotation speed.

Fifth Aspect

In the fifth aspect of the present invention, a plurality of samples are prepared by being coated with the resist solution under a plurality of conditions resulting from stepwise change in the drying rotation speed in the drying step and under the condition in which the main rotation speed and the main rotation time in the uniforming step are fixed at the condition I of the main rotation speed and the main rotation time determined according to the above mentioned first aspect. The resist film thicknesses of each sample are measured at a plurality of points within a desirably specified effective region in the substrate, and film thickness uniformity within the effective region is determined from results of film thickness distribution [range (maximum minus minimum) value or standard deviation value], within the effective region (critical area) of the measurment. The relationship is thereby determined between the drying rotation speed of each sample and the film thickness uniformity within the effective region of each sample, and this relationship is specified to be reference data B. A condition IV of the drying rotation speed for achieving maximum film thickness uniformity within the effective region is determined based on the reference data B, and resist-coating is performed in accordance with results of condition IV of the drying rotation speed.

Sixth Aspect

In the sixth aspect of the present invention, a plurality of samples are prepared by being coated with the resist solution under a plurality of conditions resulting from stepwise change in the concentration (viscosity) of the resist solution and under the condition in which the main rotation speed and the main rotation time in the uniforming step are fixed at the condition I of the main rotation speed and the main rotation time determined according to the above mentioned first aspect. The resist film thicknesses of each sample are measured at a plurality of points within a desirably specified effective region in the substrate, and a mean value of results of resist film thicknesses is determined. The relationship is thereby determined between the concentration (viscosity) of the resist solution of each sample and the mean value of the resist film thicknesses of each sample, and this relationship is specified to be reference data C. A condition V of concentration (viscosity) of the resist solution for achieving a desirably specified mean resist film thickness is determined based on the reference data C, and resist-coating is performed in accordance with results of condition V of concentration (viscosity) of the resist solution.

Seventh Aspect

In the seventh aspect of the present invention, a plurality of samples are prepared by being coated with the resist solution under a plurality of conditions resulting from stepwise change in the concentration (viscosity) of the resist solution and under the condition in which the main rotation speed and the main rotation time in the uniforming step are fixed at the condition I of the main rotation speed and the main rotation time determined according to the above mentioned first aspect, and the drying rotation speed in the drying step is fixed at the condition IV of the drying rotation speed determined according to the above mentioned fifth aspect. The resist film thicknesses of each sample are measured at a plurality of points within a desirably specified effective region in the substrate, and a mean value of results of resist film thicknesses is determined. The relationship is thereby determined between the concentration (viscosity) of the resist solution of each sample and the mean value of the resist film thicknesses of each sample, and this relationship is specified to be reference data C'. A condition V' of concentration (viscosity) of the resist solution for achieving a desirably specified mean resist film thickness is determined based on the reference data C', and resist-coating is performed in accordance with results of condition of V' of concentration (viscosity) of the resist solution.

Eighth Aspect

In the eighth aspect of the present invention, the main rotation speed and the main rotation time are selectively fixed at the condition I by the determination method for the main rotation condition according to the above mentioned first aspect or the above mentioned second aspect. The drying rotation speed is selectively fixed at the condition IV by the determination method for the drying rotation condition according to the above mentioned fifth aspect. The concentration (viscosity) of the resist solution is selectively fixed at the condition V' by the determination method for the resist concentration (viscosity) according to the above mentioned seventh aspect. Subsequently, resist-coating is performed in accordance with the condition I, condition IV and condition V'.

Ninth Aspect

In the ninth aspect of the present invention, the condition III of drying rotation speed according to the above mentioned fourth aspect is determined from the group consisting of the plural reference data, the group consisting of the plural contour maps or the group consisting of the plural bird's eye views. At this time, the drying rotation speed condition is selected in order that fluctuations in the film thickness uniformity within the effective region becomes small and stable with respect to fluctuations in the main rotation speed and/or the main rotation time in a practical coating process relative to the setting values or with respect to fluctuations in the resist concentration (viscosity) for achieving the desirably specified mean resist film thickness, and resist-coating is performed in accordance with results of condition.

Tenth Aspect

In the tenth aspect of the present invention, the condition III of drying rotation speed according to the above mentioned fourth aspect is determined from the group consisting of the plural reference data, the group consisting of the plural contour maps or the group consisting of the plural bird's eye views. At this time, the condition III of drying rotation speed is selected in order that when plural thicknesses of coatings are applied using the resist solution having the same resist concentration (viscosity), the plural thicknesses of coatings can be applied while the film thickness uniformity within the effective region is within a constant range, and resist-coating is performed in accordance with results of condition III, so as to achieve a plurality of thicknesses.

Eleventh Aspect

In the eleventh aspect of the present invention, the substrate is a square-like (square or rectangular) substrate in any one of the above mentioned first to tenth aspects.

Twelfth Aspect

In the twelfth aspect of the present invention, the spin-coating condition is determined based on at least one of the reference data determined in the above mentioned first to seventh aspects.

Thirteenth Aspect

According to the thirteenth aspect of the present invention, a mask blank (photomask blank) is provided and includes a resist film on a substrate. The substrate includes at least an opaque layer and/or a phase shifting layer having an opaque function The resist film is formed by the spin-coating method according to any one of the above mentioned first to eleventh aspects.

BRIEF DESCRIPTION OF THE DRAWINGS

FIGS. 3A and 3B are diagrams for illustrating a contour map as an example of reference data used in the spin-coating method of the present invention. FIG. 3A is a contour map showing distribution of the film thickness uniformity within an effective region with change in the main rotation speed and the main rotation time, and FIG. 3B is a contour map showing film thicknesses with change in the main rotation speed and the main rotation time.

FIG. 4A is a contour map showing distribution of the film thickness uniformity within the effective region with change in the main rotation speed and the main rotation time, and FIG. 4B is a contour map showing film thicknesses with change in the main rotation speed and the main rotation time.

FIG. 5A is a contour map showing distribution of the film thickness uniformity within the effective region with change in the main rotation speed and the main rotation time, and FIG. 5B is a contour map showing film thicknesses with change in the main rotation speed and the main rotation time.

FIG. 6A is a contour map showing distribution of the film thickness uniformity within the effective region with change in the main rotation speed and the main rotation time, and FIG. 6B is a contour map showing film thicknesses with change in the main rotation speed and the main rotation time.

FIGS. 7A and 7B are diagrams showing contour maps with change in the drying rotation speed. FIG. 7A is a contour map showing distribution of the film thickness uniformity within the effective region with change in the main rotation speed and the main rotation time, and FIG. 7B is a contour map showing film thicknesses with change in the main rotation speed and the main rotation time.

FIG. 8A is a contour map showing distribution of the film thickness uniformity within the effective region with change in the main rotation speed and the main rotation time, and FIG. 8B is a contour map showing film thicknesses with change in the main rotation speed and the main rotation time.

DESCRIPTION OF THE PREFERRED EMBODIMENTS

Figure 1:
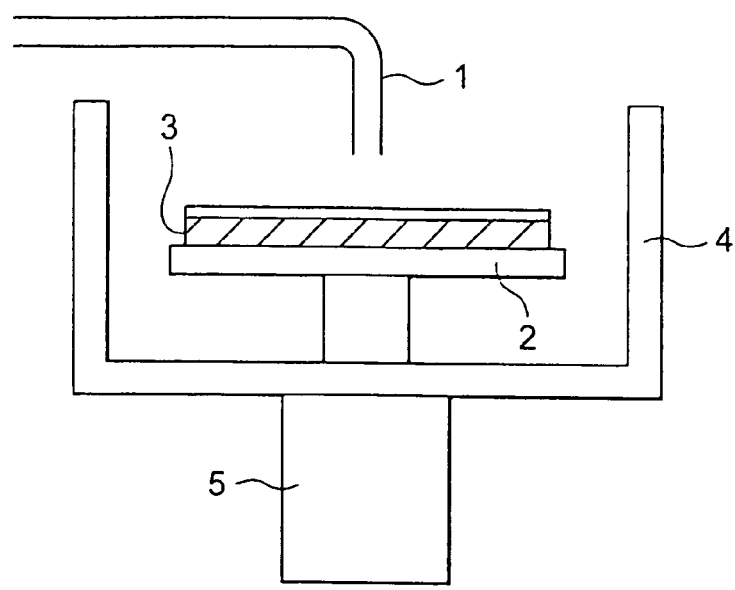
FIG. 1 is a schematic diagram showing the basic configuration of a common spin-coating device.
Figure 2:
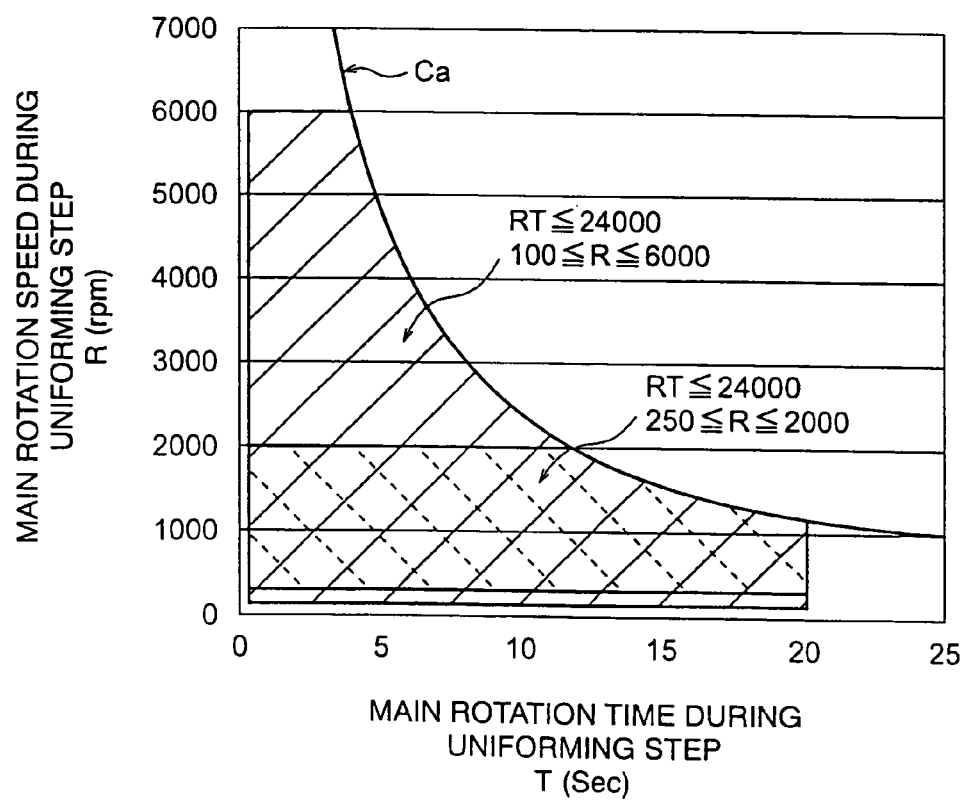
FIG. 2 is a diagram showing a range of combination of the main rotation speed and the main rotation time in a conventional method.

Some aspects of the present invention will be described below in detail with reference to application of resist solution as an example. The present invention is applied to a specific resist spin-coating method. The resist spin-coating method includes a uniforming (evening or flatting) step of dispensing a resist solution on a substrate and rotating the substrate at a predetermined main rotation speed for a predetermined main rotation time, so as to primarily make the resist film thickness uniform, and a drying step of rotating the substrate at a predetermined drying rotation speed for a predetermined drying rotation time after the uniforming step, so as to primarily dry the uniform resist film. Here, in general, a lower limit value of a drying rotation time refers to the time that elapsed before the resist film is completely dried.

In the spin-coating method according to the first aspect of the present invention, reference data A is determined. When the reference data A is determined, in the above mentioned specific resist spin-coating method, the concentration (viscosity) of the resist solution is fixed at an arbitrary concentration (for example, a concentration of a commercially available resist solution), and in addition, the drying rotation speed in the drying step is fixed at an arbitrary rotation speed (for example, 50 to 300 rpm). Under this condition, a plurality of samples are prepared by being coated with the resist solution under a plurality of conditions resulting from independent, stepwise change in parameters in uniforming step while the parameters are the main rotation speed and the main rotation time. The resist film thicknesses of each sample are measured at a plurality of points within a desirably specified effective region in the substrate, and film thickness uniformity within an effective region is determined from results of film thickness distribution [range (maximum minus minimum) value or standard deviation value], within the effective region (critical area) of the measurment. The relationship is thereby determined between the condition of combination of the main rotation speed and the main rotation time of each sample and the film thickness uniformity within the effective region of each sample, and this relationship is specified to be the reference data A. Here, film thickness uniformity within the effective region refers to a difference between a maximum value and a minimum value, or a standard deviation, of the film thicknesses in the film thickness distribution [range (maximum minus minimum) value or standard deviation value], within the effective region (critical area) of the measurment.

Examples of the above mentioned reference data A include, for example, a condition (point) of combination of the main rotation speed and the main rotation time, raw data that is recorded data of the film thickness uniformity within the effective region corresponding to each condition (point) of combination without being processed (in addition, data of a mean value of the thicknesses corresponding to each condition (point) combination, a material visually representing the film thickness uniformity within the effective region resulting from processing of this raw data, a material in which the above mentioned raw data is stored in memory device, and a material visually representing the film thickness uniformity within the effective region resulting from processing of the raw data stored in memory device.

A contour map (the second aspect) as an example of the reference data A will be described below. Explanation will be made below with reference to the case where a positive electron beam resist ZEP7000 (manufactured by Zeon Corporation) is used. However, needless to say, the present invention can be applied to other resist species. The contour map will be described as a specific example of data processing. However, needless to say, the present invention can also be applied to the case where the bird's eye view is used to make the film thickness uniformity within the effective region and the mean film thickness into three-dimensional, schematic forms.

Figure 11:
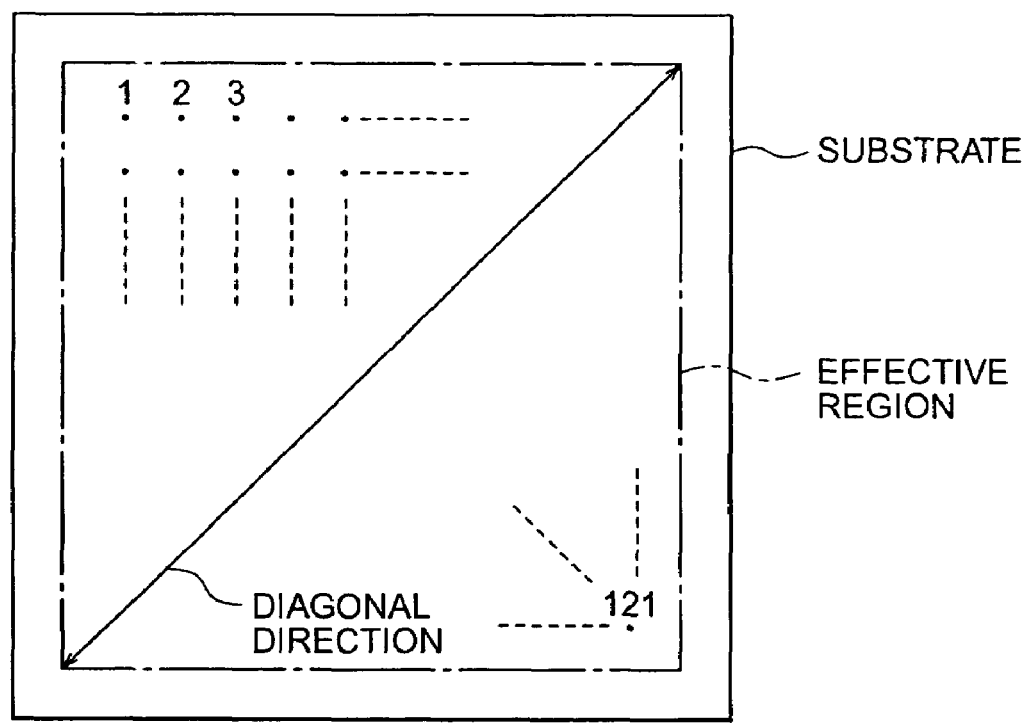
FIG. 11 is a schematic diagram for illustrating an effective region and the like arranged on a substrate.

For example, as shown in FIG. 3A, the resist concentration is fixed at 5.2%, and the drying rotation speed is fixed at 300 rpm. Under this condition, the rotation speed of a substrate 6 inches (1 inch=25.4 mm) square (152.4 mm×152.4 mm) is stepwise changed within the range of 900 to 1,800 rpm in 150 rpm intervals (seven conditions). The rotation time is stepwise changed within the range of 4 to 16 seconds in 2 seconds intervals (seven conditions). The resist solution is applied under 49 (=7×7) conditions resulting from combination of the above mentioned conditions, and a baking treatment after coating is performed at 220° C. for 10 minutes with a heat treatment device, e.g. a hot plate, so as to prepare 49 substrates. Subsequently, regarding each substrate, the film thicknesses of the resist film are measured with a spectroscopic reflection type thicknessmeter (AFT6100M manufactured by Nanometrics Japan LTD.) at 121 (=11×11) points evenly arranged all over the effective range (132 mm×132 mm) on the substrate (refer to FIG. 11), and thereby, film thickness distribution [range (maximum minus minimum) value or standard deviation value], within the effective region (critical area) of the measurment (film thickness data at individual measurement points) is determined. Film thickness uniformity within the effective region is determined based on results of film thickness distribution [range (maximum minus minimum) value or standard deviation value], within the effective region (critical area) of the measurment data. Here, the film thickness uniformity within the effective region is determined from the difference between a maximum value and a minimum value of the film thicknesses. A mean value of the film thicknesses measured at 121 points are calculated so as to determine the mean resist film thickness for later use.

The data of these main rotation speed, main rotation time, film thickness uniformity within the effective region and mean resist film thickness are stored in a data memory device.

Data processing is performed in order to visually representing the relationship among the main rotation speed, main rotation time and the film thickness uniformity within the effective region, as described below.

The film thickness uniformity within the effective region is plotted at a proper position in a graph having the horizontal axis indicating the main rotation speed and the vertical axis indicating the main rotation time. Virtual film thickness uniformity within the effective region data is allocated based on the plotted film thickness uniformity within the effective region data in the horizontal axis direction, the vertical axis direction and both diagonal directions.

With respect to this allocated virtual film thickness uniformity within the effective region data, points corresponding to stepwise setting film thickness uniformity within the effective region (18 stages of 30 angstroms, 40 angstroms, 50 angstroms and the like up to 200 angstroms) within the range of 20 to 200 angstroms in 10 angstroms intervals are determined (allocated), and points corresponding to the same film thickness uniformity within the effective region are bonded by a contour line so as to prepare a contour map. The above mentioned contour map can be prepared by data processing (software processing) of the date stored in the data memory device.

The range of the main rotation speed, main rotation time and the film thickness uniformity within the effective region, described above, can be appropriately adjusted, and preferably, the above mentioned interval is reduced to the extent that the level of the film thickness uniformity within the effective region can be precisely judged. Preferably, the range of the stepwise change in each of the above mentioned main rotation speed and main rotation time is increased to the extent that the tendency of the change in the film thickness uniformity within the effective region can be grasped, and the range of excellent film thickness uniformity within the effective region can be grasped.

When a substrate is coated with resist solution in practice, a condition I of combination of the main rotation speed and the main rotation time is determined from the above mentioned reference data A or the above mentioned contour map or bird's eye view in order to achieve desirably specified film thickness uniformity within the effective region, and resist-coating is performed in accordance with results of condition I of combination. For example, the resist-coating can be performed under a condition in an optimum region exhibiting maximum (the best) film thickness uniformity within the effective region of 30 to 40 angstroms, or at a region exhibiting high film thickness uniformity within the effective region of 40 to 50 angstroms shown in FIG. 3A. In this case, the resist-coating can be performed under a condition capable of achieving desirably specified film thickness uniformity within the effective region. However, a desirably specified film thickness is not always achieved.

In the example described above, the reference data A is visualized by preparing the contour map of the film thickness uniformity within the effective region. However, the reference data A may be visualized in such a manner that the value of the film thickness uniformity within the effective region continuously varies in each direction instead of stepwise setting of the range of film thickness uniformity within the effective region. Known examples of such visualization include a variable-density treatment with a gray scale and a continuation treatment using change in color (pseudo-color). The data of the above mentioned virtual film thickness uniformity within the effective region can be allocated in two directions of the horizontal direction and the vertical direction, or in one diagonal direction, although the precision is reduced. Furthermore, the condition I of combination of the main rotation speed and the main rotation time can also be determined directly from the reference data A or through the software processing in order to achieve desirably specified film thickness uniformity within the effective region.

FIG. 3B is a diagram of a contour map of a coating film thickness determined in a manner similar to that in FIG. 3A. The mean resist film thickness determined in the above mentioned example is plotted at a proper position in a graph having the horizontal axis indicating the main rotation speed and the vertical axis indicating the main rotation time. For details, the contour map of the mean resist-coating film thickness is determined as described below.

The mean resist film thickness determined in the above mentioned example is plotted at a proper position in a graph having the horizontal axis indicating the main rotation speed and the vertical axis indicating the main rotation time, based on the above mentioned reference data A. Virtual mean resist film thickness data is allocated based on the plotted mean resist film thickness data in the horizontal axis direction, the vertical axis direction and a diagonal direction in which the mean film thickness exhibits a decreasing or increasing tendency.

With respect to this allocated virtual mean resist film thickness data, points corresponding to stepwise setting mean resist film thickness (11 stages of 2,000 angstroms, 2,500 angstroms and the like up to 7,500 angstroms) within the range of 2,000 to 7,500 angstroms in 500 angstroms intervals are determined (allocated), and points corresponding to the same resist film thickness are bonded by a contour line so as to prepare a contour map of the mean resist film thickness (FIG. 3B).

Under the condition in the optimum region exhibiting film thickness uniformity within the effective region of 30 to 40 angstroms shown in FIG. 3A, a coating having a film thickness within the range of about 3,500 to 4,700 angstroms can be applied (FIG. 3B). Likewise, under the condition in the region exhibiting film thickness uniformity within the effective region of 41 to 50 angstroms shown in FIG. 3A, a coating having a film thickness within the range of about 3,300 to 4,800 angstroms can be applied (FIG. 3B). Consequently, as described above, when a desirably specified film thickness is within these film thickness range, resist-coating can be performed at these conditions.

In the above mentioned contour map of the mean resist film thickness, the range of the main rotation speed, main rotation time and the mean resist film thickness can be appropriately adjusted in a manner similar to that in the above description. It is preferable to use the above mentioned contour map of the mean resist film thickness, because the amount of information is increased. For example, the stability of the coating film thickness and the like is made clear relative to fluctuations in the main rotation speed and the main rotation time.

In the spin-coating method according to the third aspect of the present invention, a plurality of reference data A according to the above mentioned first aspect or contour maps or bird's eye views according to the above mentioned second aspect are determined based on stepwise change (at least two stages) in the concentration (viscosity) of the resist solution. The optimum condition II of concentration (viscosity) of the resist solution is determined among the group consisting of the plural reference data A, the group consisting of the plural contour maps or the group consisting of the plural bird's eye views, and resist-coating is performed in accordance with results of condition II of concentration (viscosity) of the resist solution. That is, the spin-coating method according to the third aspect is a method for optimizing the concentration of the resist solution through the use of the reference data A according to the above mentioned first aspect or the contour maps or bird's eye views according to the above mentioned second aspect.

In the third aspect, first, for example, a resist concentration capable of providing a region in which the film thickness uniformity within the effective region is at a maximum and a contour map corresponding to that are selected among the above mentioned group of plural contour maps. Resist-coating is performed under a condition in the optimum region in which the film thickness uniformity within the effective region is at a maximum in the selected contour map.

Figure 4A:
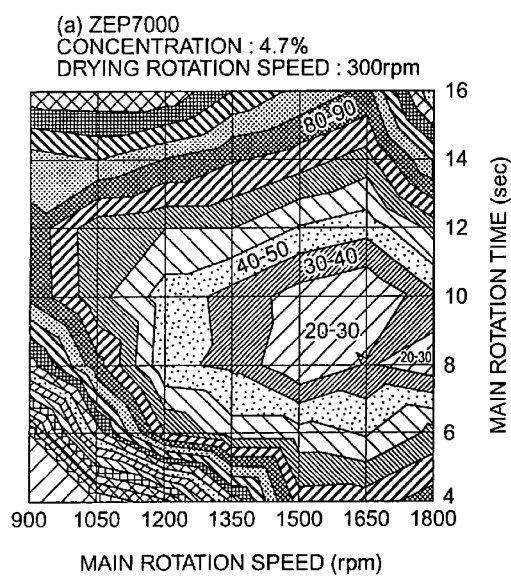
FIGS. 4A and 4B are diagrams showing contour maps with change in the resist concentration.

Specifically, for example, as shown in FIG. 4A, the resist concentration is changed to 4.7%, and the drying rotation speed is fixed at 300 rpm. In a manner similar to that in the above description, a contour map is determined with respect to a substrate 6 inches square. When the resist concentration is 4.7%, film thickness uniformity within the effective region of 20 to 30 angstroms or less can be achieved, as is clear from FIG. 4A. Consequently, it is clear that the film thickness uniformity within the effective region can be improved compared with the film thickness uniformity within the effective region of 30 to 40 angstroms or less in the case where the resist concentration is 5.2% shown in FIG. 3A. However, for example, when the resist concentration is 4.7%, the film thickness is limited to within the range of about 2,800 to 3,800 angstroms in order to apply the resist solution while the film thickness uniformity within the effective region is within the range of 20 to 30 angstroms or less. Therefore, a condition of combination of the main rotation speed and the main rotation time for achieving a desirably specified mean resist film thickness and a condition of combination of the main rotation speed and the main rotation time for achieving a desirably specified film thickness uniformity within the effective region may not agree with each other in practice.

In such a case, a method shown below can be adopted, for example.

In the third aspect, second, for example, selection of a contour map is performed among the above mentioned group of the plural contour maps, so that the selected contour map can provide a desirably specified resist film thickness under a condition in the optimum region in which the film thickness uniformity within the effective region is at a maximum or in the region in which the film thickness uniformity within the effective region is high. Consequently, resist-coating is performed under a condition in which the film thickness uniformity within the effective region of the resist film is high, and a desirably specified film thickness can be achieved.

Specifically, for example, when a desirably specified resist film thickness is 4,000 to 4,500 angstroms, the contour map shown in FIG. 3A is selected, and thereby, the resist film thickness of 4,000 to 4,500 angstroms can be achieved under a condition in the region of the film thickness uniformity within the effective region of 31 to 40 angstroms. When the contour map shown in FIG. 4A is selected, a resist film thickness of 2,200 to 3,750 angstroms can be achieved under a condition in the region of the film thickness uniformity within the effective region of 31 to 40 angstroms.

In each of the above mentioned examples, the resist concentration is simply changed in two stages. However, needles to say, a more optimum condition may be found out by increasing the range and the number of stages in the change.

In the third aspect, by comparing the plural contour maps in the group according to the third aspect, it was made clear that the relative distribution of the film thickness uniformity within the effective region had almost no tendency to change with changes in the resist concentration. Put another way, it was made clear that no change or almost no change occurred in the optimum condition (one point or a certain range) of the main rotation speed and the main rotation time for achieving maximum film thickness uniformity within the effective region among the above mentioned group of the contour maps even when the resist concentration was changed.

Figure 4B:
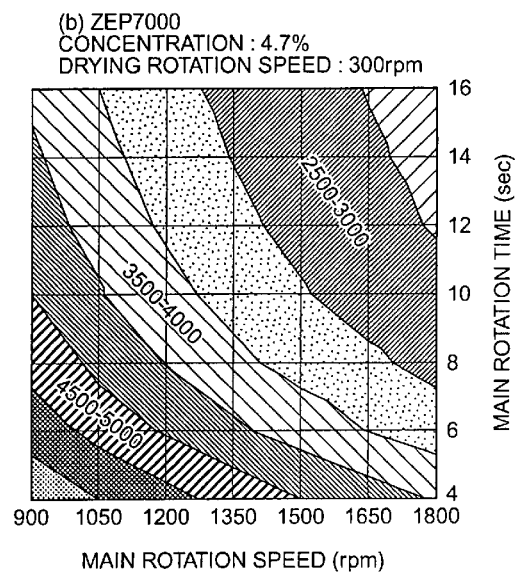

For example, it can be verified from the comparison between FIG. 3B and FIG. 4B that the absolute value of the mean resist film thickness is changed when the concentration of the resist solution is changed, while it can be verified from the comparison between FIG. 3A and FIG. 4A that the tendency of the distribution of the film thickness uniformity within the effective region is hardly changed relatively. That is, it can be verified that the range of the condition of the main rotation speed and the main rotation time for achieving maximum film thickness uniformity within the effective region is hardly changed, while the main rotation speed is about 1,500 to 1,650 rpm, and the main rotation time is about 8 to 10 seconds.

Figure 9:
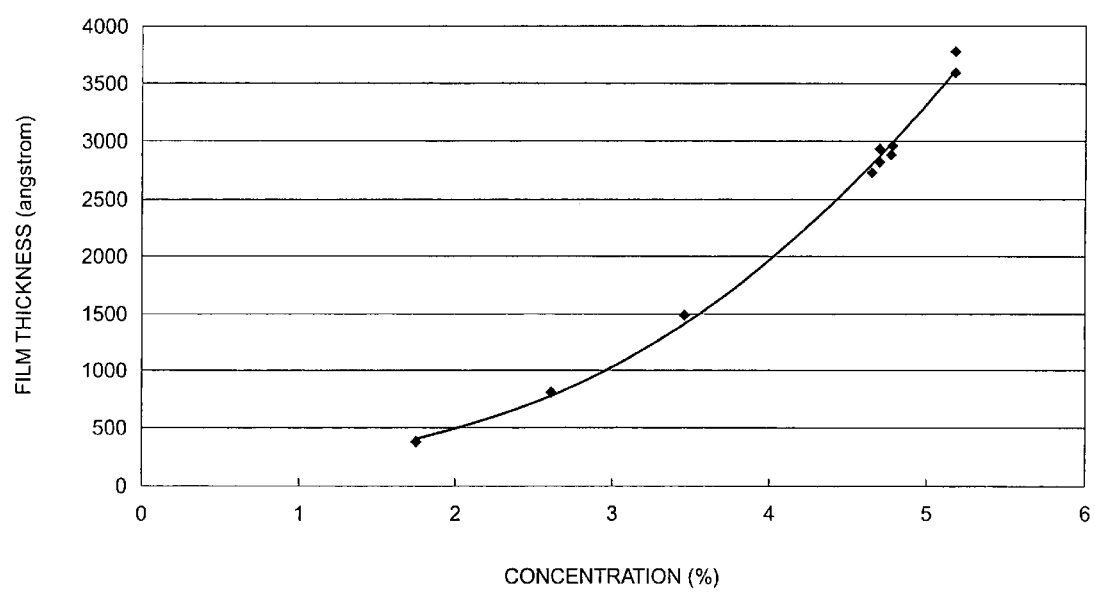
FIG. 9 is a diagram showing the relationship between the resist film thickness and the resist concentration.

Consequently, the following method is considered as a method of simply, reliably determining an optimum resist concentration condition for achieving a desirably specified resist film thickness while maximum film thickness uniformity within the effective region is ensured. A distribution diagram of the film thickness uniformity within the effective region is prepared at an arbitrary resist concentration, and thereby, a condition I of combination of the main rotation speed and the main rotation time for achieving maximum film thickness uniformity within the effective region is determined. Subsequently, a resist concentration for achieving a desirably specified film thickness under results of condition I is determined from, for example, a graph (FIG. 9) showing the relationship between the film thickness and the resist concentration, while the graph is prepared under the condition I (the sixth aspect). The sixth aspect will be described later. In the spin-coating method according to the fourth aspect of the present invention, a plurality of reference data A according to the above mentioned first aspect or contour maps or bird's eye views according to the above mentioned second aspect are determined based on stepwise change (at least two stages) in the drying rotation speed. The condition III of drying rotation speed for achieving maximum film thickness uniformity within the effective region is determined among the group of the plural reference data, the group of the plural contour maps or the group of the plural bird's eye views, and resist-coating is performed in accordance with results of condition III of drying rotation speed. That is, the fourth aspect is a method for optimizing the drying rotation speed through the use of the reference data A according to the above mentioned first aspect or the contour maps or bird's eye views according to the above mentioned second aspect.

Explanations will be made below with reference to a specific example. For example, as shown in FIGS. 4A to 8A, contour maps were prepared with respect to resist solution having a resist concentration of 4.7% on a substrate 6 inches square in a manner similar to that in the above description, while the drying rotation speed was changed within the range of 50 to 300 rpm in stages of 50 rpm (FIG. 5A), 150 rpm (FIG. 6A), 200 rpm (FIG. 7A), 250 rpm (FIG. 8A) and 300 rpm (FIG. 4A).

Figure 5A:
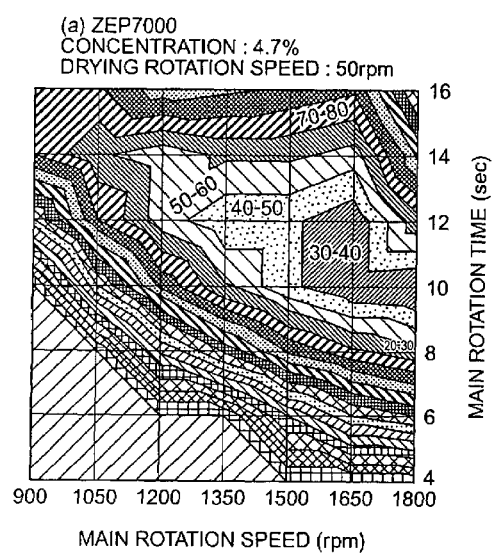
FIGS. 5A and 5B are diagrams showing contour maps with change in the drying rotation speed.
Figure 5B:
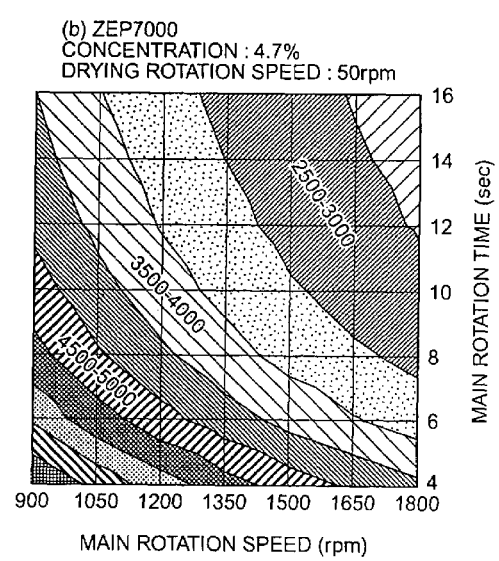
Figure 6A:
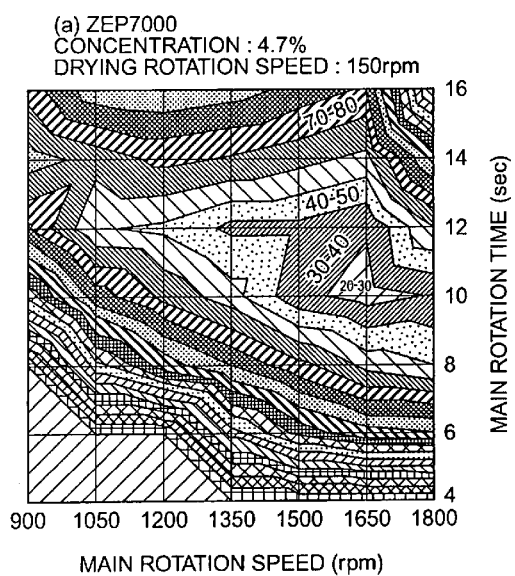
FIGS. 6A and 6B are diagrams showing contour maps with change in the drying rotation speed.
Figure 6B:
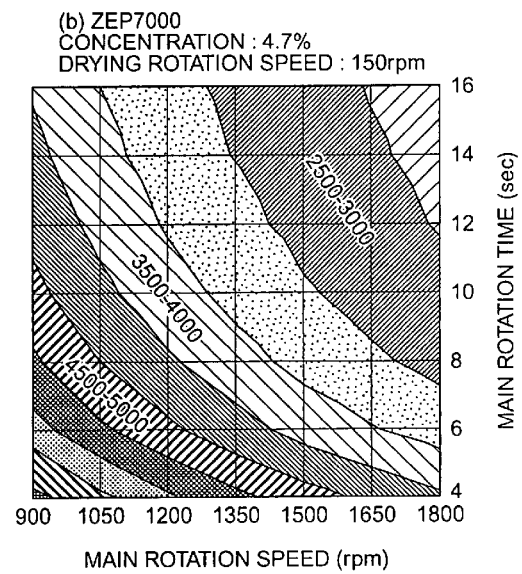

As is clear from the above mentioned FIGS. 4A and 6A to 8A, when the drying rotation speed is 150 to 300 rpm, the film thickness uniformity within the effective region of 20 to 30 angstroms or less can be achieved, and therefore, the film thickness uniformity within the effective region can be improved compared with the film thickness uniformity within the effective region of 30 to 40 angstroms in the case where the drying rotation speed is 50 rpm, as shown in FIG. 5A. Consequently, in the fourth aspect, first, the film thickness uniformity within the effective region of the resist film can be at a maximum by applying the resist solution while the drying rotation speed is set at 150 to 300 rpm in order that the film thickness uniformity within the effective region becomes a maximum.

Figure 8A:
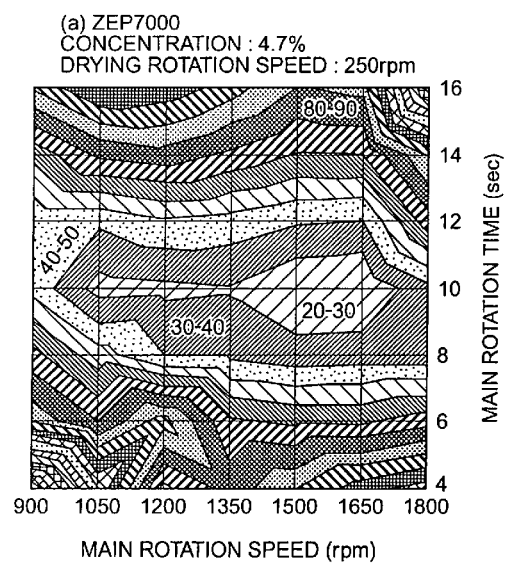
FIGS. 8A and 8B are diagrams showing contour maps with change in the drying rotation speed.
Figure 8B:
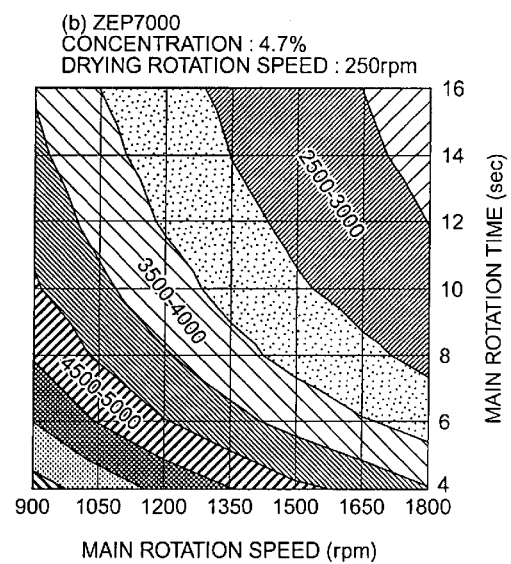

As is clear from FIGS. 4A, 7A and 8A, when the drying rotation speed is 200 to 300 rpm, the optimum region is increased, and the film thickness uniformity within the effective region is at a maximum of 20 to 30 angstroms in the optimum region. When the range of the optimum region is increased, as described above, in the case where, for example, the main rotation speed and the main rotation time fluctuate relative to setting values in a practical coating process, the resist solution is applied under a condition within the optimum region with a high possibility, and therefore, exhibits stability against the fluctuations. That is, when the fluctuations in the main rotation speed and the main rotation time remain within the optimum region, the resist-coating can be performed within the range in which the maximum film thickness uniformity within the effective region can be achieved. When a condition in the midsection of the optimum region is selected, the resist solution can be desirably applied under a condition in the optimum region even if the main rotation speed and the main rotation time fluctuate to some extent. Likewise, these matters apply to fluctuations in the resist concentration (viscosity) for achieving a desirably specified mean resist film thickness.

In the fourth aspect, second, when the above mentioned condition III of drying rotation speed is determined from the group of the above mentioned plural reference data in the spin-coating method according to the fourth aspect, the condition of the drying rotation speed can be selected in order that fluctuations in the film thickness uniformity within the effective region becomes small and stable with respect to fluctuations of the main rotation speed and/or the main rotation time in a practical coating process relative to the setting values or with respect to fluctuations in the resist concentration (viscosity) for achieving the desirably specified mean resist film thickness, and resist-coating can be performed in accordance with results of condition (the ninth aspect). This method is very effective with respect to a resist film having film thickness uniformity within the effective region very sensitive to coating conditions (the main rotation speed, the main rotation time and the like).

As is clear from FIGS. 4A, 7A and 8A, when the drying rotation speed is 200 to 300 rpm, the optimum region is increased while the film thickness uniformity within the effective region is at a maximum of 20 to 30 angstroms in the optimum region, or the region in which the film thickness uniformity within the effective region is high 30 to 40 angstroms is increased. That is, it is clear that, by optimization of the drying rotation speed, an increase can be achieved in the range of the film thickness when coating is performed with the resist solution having the same concentration, while results of film thickness uniformity within the effective region remains within the same range. Consequently, coatings having plural sorts of film thickness can be applied using the resist solution having the same resist concentration (viscosity), while results of film thickness uniformity within the effective region remains within the same range. For example, when the drying rotation speed is 250 rpm shown in FIG. 8A, the optimum region is increased while the film thickness uniformity within the effective region is at a maximum of 20 to 30 angstroms, and coatings having plural sorts of film thickness within the range of about 2,500 to 4,500 angstroms can be applied while the film thickness uniformity within the effective region remains within the same range of 20 to 30 angstroms, as is clear from FIG. 8B.

Consequently, in the fourth aspect, third, when the above mentioned condition III of drying rotation speed is determined from the group of the above mentioned plural reference data in the spin-coating method according to the fourth aspect, the condition III of drying rotation speed is selected in order that when coatings having plural sorts of film thickness are applied using the resist solution having the same resist concentration (viscosity), coatings having plural film thicknesses can be applied while the film thickness uniformity within the effective region is within a constant range. Therefore, resist-coating can be performed to achieve a plurality of film thicknesses in accordance with results of condition III (the tenth aspect).

In the fourth aspect, by comparing the plural contour maps in the group according to the fourth aspect, it was made clear that no change or almost no change occurred in the optimum condition (range) of the main rotation speed and the main rotation time for achieving maximum film thickness uniformity within the effective region in each contour map even when the drying rotation speed was changed. For example, it can be verified from FIGS. 4A to 8A that the condition (one point or a certain range) of the main rotation speed and the main rotation time for achieving maximum film thickness uniformity within the effective region (the main rotation speed: about 1,500 to 1,650 rpm, the main rotation time: about 8 to 10 seconds) is hardly changed.

Figure 10:
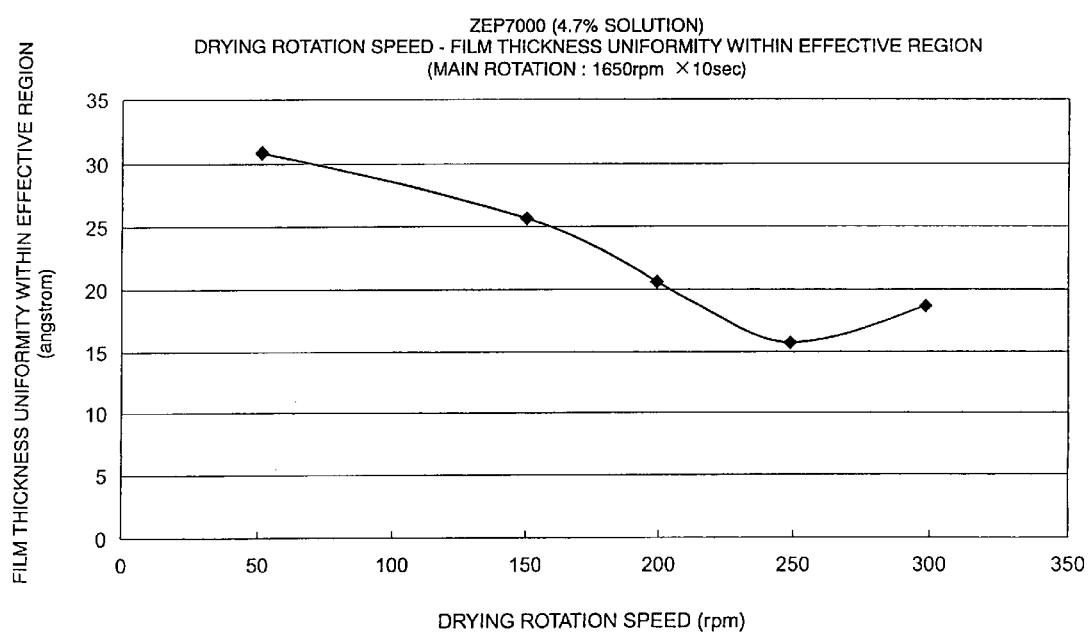
FIG. 10 is a diagram showing the relationship between the film thickness uniformity within the effective region and the drying rotation speed.

Consequently, the following method is considered as a method of simply optimizing the drying rotation speed. A contour map according to the second aspect is prepared at an arbitrary resist concentration. A condition I of combination (one point or a certain range) of the main rotation speed and the main rotation time for achieving maximum (best) film thickness uniformity within the effective region is determined. Subsequently, a drying rotation speed capable of achieving the maximum film thickness uniformity within the effective region under the condition I can be determined from, for example, a graph (FIG. 10) showing the relationship between the film thickness uniformity within the effective region and the drying rotation speed, while the graph is prepared under the condition I (the fifth aspect). That is, the fifth aspect is a simple technique for optimizing the drying rotation speed. This technique does not require determination of the contour map of the resist film thickness shown in FIG. 3B, and therefore, is simple. Furthermore, this technique does not require determination of the contour map shown in FIG. 3A indicating the distribution of the film thickness uniformity within the effective region on a drying rotation speed basis, and therefore, is simple.

In the fifth aspect, a plurality of samples are prepared by being coated with the resist solution under a plurality of conditions resulting from stepwise change in the drying rotation speed in the drying step and under the condition fixed at the condition I of the main rotation speed and the main rotation time determined according to the first aspect. The resist film thicknesses of each sample are measured at a plurality of points within a desirably specified effective region in the substrate, and film thickness uniformity within the effective region is determined from results of film thickness distribution [range (maximum minus minimum) value or standard deviation value], within the effective region (critical area) of the measurement. The relationship is thereby determined between the drying rotation speed of each sample and the film thickness uniformity within the effective region of each sample, and this relationship is specified to be reference data B. A condition IV of the drying rotation speed for achieving maximum film thickness uniformity within the effective region is determined based on the above mentioned reference data B, and resist-coating can be performed in accordance with results of condition IV of the drying rotation speed and with, in general, the condition I of the main rotation speed and the main rotation time fixed as described above.

The sixth aspect takes advantage of the tendency of the relative film thickness distribution [range (maximum minus minimum) value or standard deviation value], within the effective region (critical area) of the measurment to hardly change with the change in the resist concentration, as described above. That is, the sixth aspect is a method for simply, reliably determining an optimum coating condition (a main rotation speed, a main rotation time and a resist concentration) for achieving a desirably specified resist film thickness without depending on trial-and-error methods by taking advantage of the fact that the optimum condition (one point or a certain range) of the main rotation speed and the main rotation time for achieving maximum film thickness uniformity within the effective region in the group of contour maps is not changed or is hardly changed even when the resist concentration is changed.

That is, since the main rotation condition for increasing the film thickness uniformity within the effective region is not changed even when the resist concentration (viscosity) is changed, this main rotation condition for increasing the film thickness uniformity within the effective region is fixed. Subsequently, the resist concentration (viscosity) is changed in order to achieve a predetermined film thickness, and thereby, the resist concentration (viscosity) capable of achieving maximum film thickness uniformity within the effective region and a desirably specified film thickness can be univocally determined. Therefore, the optimization of the resist concentration can be achieved.

Conventionally, since such a method for optimizing a resist concentration was not established, an optimum condition, e.g. a main rotation speed condition, was determined by trial and error at a given resist concentration. When the resist concentration was changed, the optimum condition, e.g. a main rotation speed condition, was determined by trial and error with the changed resist concentration. This is because the optimum main rotation speed condition was believed to change as the resist concentration was changed.

In the sixth aspect, the reference data A according to the above mentioned first aspect or the contour map or bird's eye view according to the above mentioned second aspect is prepared at a specific resist concentration. A condition I of combination of the main rotation speed and the main rotation time for achieving maximum film thickness uniformity within the effective region is determined. Subsequently, a resist concentration capable of achieving a desirably specified resist film thickness under the condition I can be determined from, for example, a graph (FIG. 9) showing the relationship between the film thickness and the resist concentration, while the graph is prepared under the condition I.

That is, in the sixth aspect, a plurality of samples are prepared by being coated with the resist solution under a plurality of conditions resulting from stepwise change in the concentration (viscosity) of the resist solution and under the condition fixed at the condition I of the main rotation speed and the main rotation time determined according to the above mentioned first aspect. The resist film thicknesses of each sample are measured at a plurality of points within a desirably specified effective region in the substrate, and a mean value of results of resist film thicknesses is determined. The relationship is thereby determined between the concentration (viscosity) of the resist solution of each sample and the mean value of the resist film thicknesses of each sample, and this relationship is specified to be reference data C. A condition V of concentration (viscosity) of the resist solution for achieving a desirably specified mean resist film thickness is determined based on the above mentioned reference data C, and resist-coating is performed in accordance with results of condition of V of concentration (viscosity) of the resist solution and with, in general, the condition I of the main rotation speed and the main rotation time fixed as described above.

In the seventh aspect, the technique according to the above mentioned sixth aspect is performed under the condition in which the drying rotation speed is optimized by the simple optimization technique for the drying rotation speed according to the fifth aspect described above.

The eighth aspect relates to a determination procedure of the main rotation condition, the drying rotation condition and the resist concentration condition. The reference data A according to the above mentioned first aspect or the contour map or bird's eye view according to the above mentioned second aspect is prepared at an arbitrary resist concentration. A condition I of combination of the main rotation speed and the main rotation time for achieving maximum film thickness uniformity within the effective region is determined (the first or second aspect).

The condition IV of the drying rotation speed capable of achieving maximum film thickness uniformity within the effective region under the above mentioned condition I is determined from, for example, a graph (FIG. 10) showing the relationship between the film thickness uniformity within the effective region and the drying rotation speed, while the graph is prepared under the condition I (the fifth aspect).

Under a condition fixed at the optimum main rotation condition I and at the optimum drying rotation condition IV, a resist concentration condition V' for achieving a desirably specified resist film thickness is determined from, for example, a graph (FIG. 9) showing the relationship between the film thickness and the resist concentration, while the graph is prepared under the condition I (the seventh aspect).

As described above, the resist concentration is finally determined in order to achieve a desirably specified resist film thickness.

According to the eighth aspect, the main rotation condition, the drying rotation condition and the resist concentration condition can be univocally determined in order to achieve maximum film thickness uniformity within the effective region and a desirably specified film thickness.

That is, in the eighth aspect, the main rotation speed and the main rotation time are selectively fixed at the condition I by the determination method for the main rotation condition according to the first aspect or the second aspect. The drying rotation speed is selectively fixed at the condition IV by the determination method for the drying rotation condition according to the fifth aspect. The concentration (viscosity) of the resist solution is selectively fixed at the condition V' by the determination method for the concentration (viscosity) of the resist solution according to the seventh aspect. Subsequently, resist-coating is performed in accordance with the condition I, condition IV and condition V'.

Eleventh Aspect

The eleventh aspect is specified because effects and necessity of the present invention are especially significant when the substrate is a square-like (square or rectangular) substrate. Examples of square-like (square or rectangular) substrates include quadrangular substrates, for example, a square and a rectangle.

The present invention is not limited to the case where resist solution is applied to a substrate including a thin film, e.g. an opaque layer and/or a phase shifting layer having an opaque function, but also include the case where coating is applied to form a resist bottom anti-reflective coating, a resist top anti-reflective layer, a resist top protective film, a conductive film, other coating films, an arbitrary combination thereof or the like. Furthermore, the present invention include the case where coating is applied to form a resist film, a resist bottom anti-reflective coating, a resist top anti-reflective layer, a resist top protective film, a conductive film, other coating films, an arbitrary combination thereof or the like on a substrate including no thin film.

Twelfth Aspect

The twelfth aspect is a determination method for a resist-coating condition in which the resist-coating condition is determined based on at least one of reference data determined in the resist spin-coating methods according to the above mentioned first to seventh aspects. Here, examples of the resist-coating condition include, for example, a main rotation speed, a main rotation time, a drying rotation speed, a drying rotation time, a resist concentration, a sort of resist solution and a solvent.

Thirteenth Aspect

The thirteenth aspect is a mask blank (photomask blank) including a resist film, a resist bottom anti-reflective coating, a resist top anti-reflective layer, a resist top protective film, a conductive film, other coating films, an arbitrary combination thereof or the like arranged on a substrate including at least an opaque layer and/or a phase shifting layer having an opaque function by the resist spin-coating method according to any one of the above mentioned first to tenth aspects.

Embodiments

Resist-coating was performed using 8.5% solution of FEP171 (manufactured by FUJIFILM Arch Co., Ltd.) in accordance with the above mentioned eighth aspect. FEP171 was a positive electron beam resist, and a solvent of the solution was a mixed solution of PGMEA (propylene glycol monomethyl ether acetate) and PGME (propylene glycol monomethyl ether) at a ratio of 8 to 2.

Specifically, 8.5% solution of FEP171 was used, and the drying rotation speed was fixed at 300 rpm. A substrate 6 inches square (152.4 mm square) was used, and the substrate had a thickness of 0.25 inches (6.35 mm). The main rotation speed was stepwise changed within the range of 750 to 1,750 rpm in 250 rpm intervals (5 conditions), and the main rotation time was stepwise changed within the range of 1 to 5 seconds in 1 second intervals (5 conditions). Regarding 25 (=5×5) conditions resulting from combination of the above mentioned conditions, 25 sample substrates coated with FEP171 were prepared. The film thicknesses of each sample were measured at 121 (=11×11) points uniformly located all over an effective region of 132 mm by 132 mm in the midsection of the substrate by using a spectroscopic reflection type thicknessmeter (AFT6100M manufactured by Nanometrics Japan LTD.), and thereby, film thickness distribution [range (maximum minus minimum) value or standard deviation value], within the effective region (critical area) of the measurment (film thickness data at individual measurement points) was determined.

Regarding each sample substrate, film thickness uniformity within the effective region was determined as a difference between the maximum value and the minimum value of the film thicknesses based on results of film thickness distribution data (reference data A) within the effective region (critical area) of the measurment. The mean value was calculated from film thicknesses measured at the above mentioned 121 points, and thereby, the mean film thickness of each sample substrate was determined.

The data with respect to the above mentioned combination of the main rotation speed and the main rotation time, the film thickness uniformity within the effective region and the mean film thickness were stored in data memory device. Data processing was performed in accordance with the above mentioned technique in order to visually represent the relationship between the combination of the main rotation speed and the main rotation time and the film thickness uniformity within the effective region and the relationship between the combination of the main rotation speed and the main rotation time and the mean film thickness.

With respect to the processed data of the relationship between the combination of the main rotation speed and the main rotation time and the film thickness uniformity within the effective region, points corresponding to stepwise setting film thickness uniformity within the effective region (7 stages of 50 angstroms, 60 angstroms, 70 angstroms and the like up to 100 angstroms and 100 angstroms or more) were determined (allocated) within the range of 40 to 100 angstroms in 10 angstroms intervals, and points corresponding to the same film thickness uniformity within the effective region were bonded by a contour line so as to prepare a contour map.

Figure 13:
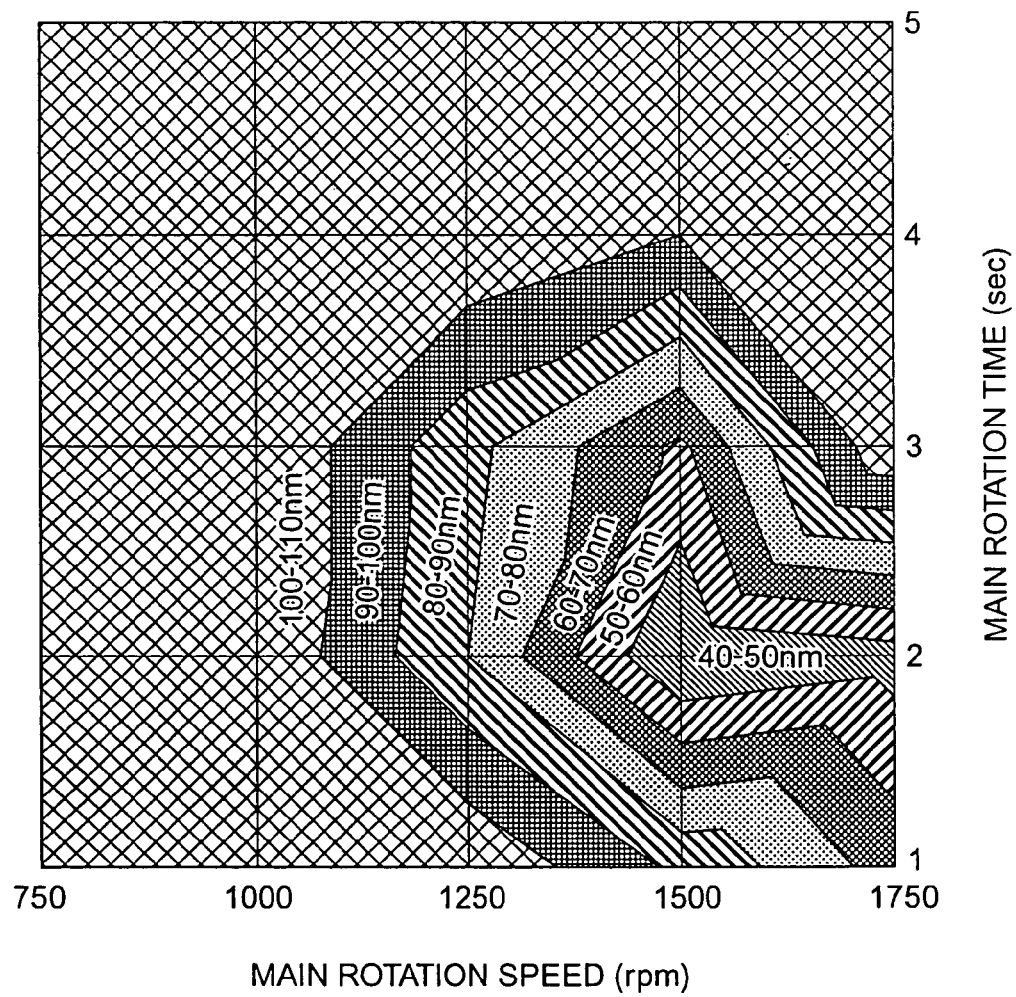
FIG. 13 is a diagram for illustrating a contour map as an example of reference data used in the spin-coating method according to an embodiment of the present invention, and is a contour map showing distribution of the film thickness uniformity within the effective region with change in the main rotation speed and the main rotation time.

FIG. 13 is a diagram showing a contour map. The film thickness uniformity within the effective region determined as described above is plotted at a proper position in a graph having the horizontal axis indicating the main rotation speed and the vertical axis indicating the main rotation time, and the contour map was thereby determined. The above mentioned contour map was prepared by data processing (software processing) of the date stored in the data memory device.

A combination of the main rotation speed and the main rotation time, capable of achieving maximum (best) film thickness uniformity within the effective region (that is, condition I) was determined from the above mentioned reference data A and the contour map. That is, the main rotation condition I was specified to be "a main rotation speed of 1,500 rpm and a main rotation time of 2 seconds" because maximum film thickness uniformity within the effective region of 40 angstroms was achieved in the above mentioned reference data A and the contour map.

Figure 14:
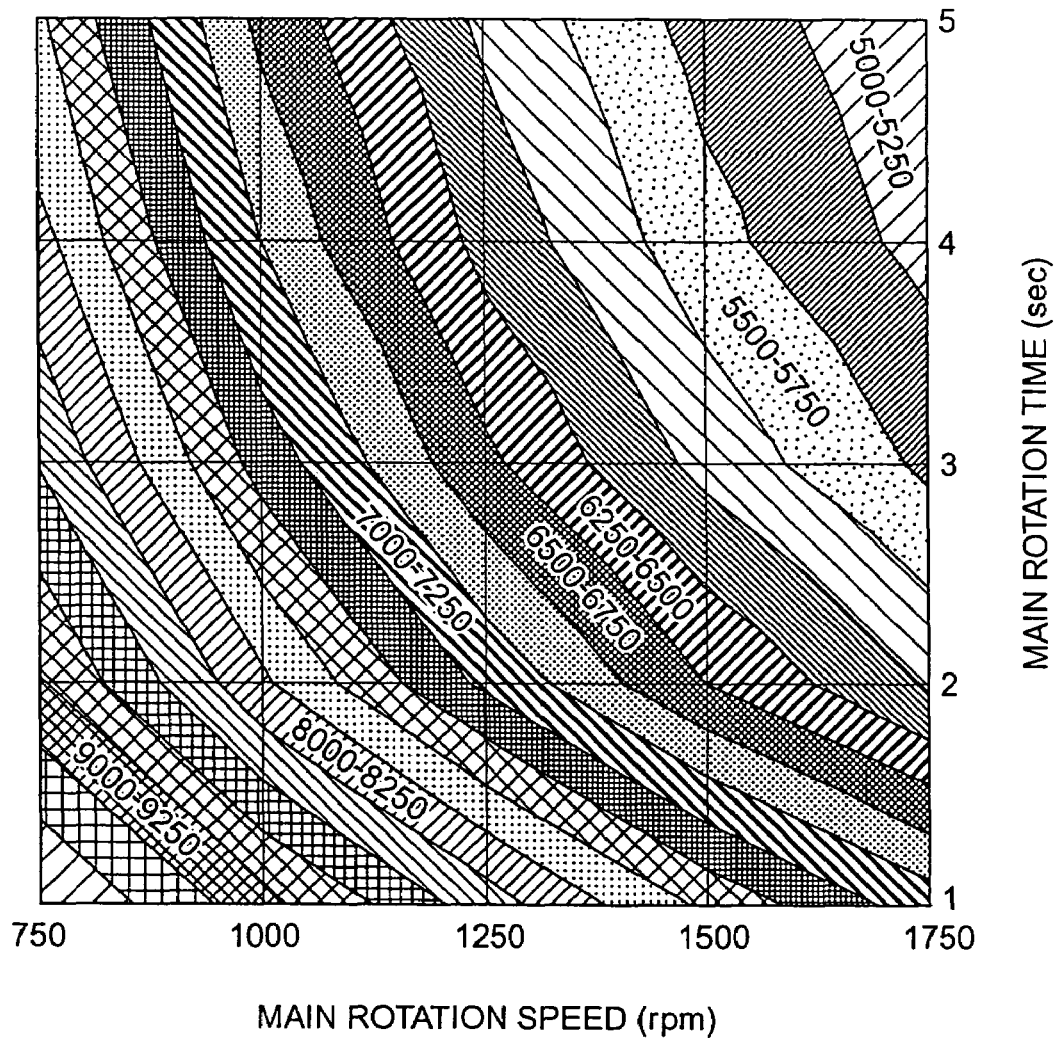
FIG. 14 is a diagram for illustrating a contour map as an example of reference data used in the spin-coating method according to an embodiment of the present invention, and is a contour map showing film thicknesses with change in the main rotation speed and the main rotation time.

FIG. 14 is a diagram showing a contour map. With respect to the processed data of the relationship between the combination of the main rotation speed and the main rotation time and the mean film thickness, points corresponding to stepwise setting mean film thicknesses in 250 angstroms intervals were determined (allocated), and points corresponding to the same mean film thickness were bonded by a contour line so as to prepare the contour map having the vertical axis indicating the main rotation speed and the horizontal axis indicating the main rotation time.

A mean value of the coating film thicknesses was 6,488 angstroms under the condition in which the maximum film thickness uniformity within the effective region of 40 angstroms was achieved, that is, in the case where the main rotation speed was specified to be 1,500 rpm, and the main rotation time was specified to be 2 seconds. Consequently, a desirably specified film thickness of 5,000 angstroms, or another desirably specified film thickness of 3,000 angstroms was not achieved.

Subsequently, the drying rotation speed was optimized. As described above, almost no change occurs in the condition of combination of the main rotation speed and the main rotation time for achieving maximum film thickness uniformity within the effective region in the contour map representing the distribution of the film thickness uniformity within the effective region even when the drying rotation speed is changed. In consideration of this fact, optimization of the drying rotation speed was performed as described below.

A plurality of sample substrates were prepared by coating substrates 6 inches square having a thickness of 0.25 inches with FEP171 having a resist concentration of 8.5%, while the main rotation speed was fixed at 1,500 rpm, the main rotation time was fixed at 2 seconds, and the drying rotation speed was stepwise changed within the range of 100 to 300 rpm in 50 rpm intervals. The film thickness uniformity within the effective region of each sample substrate was measured in a manner described above, and the relationship (graph) between the film thickness uniformity within the effective region and the drying rotation speed was determined (FIG. 15).

Figure 15:
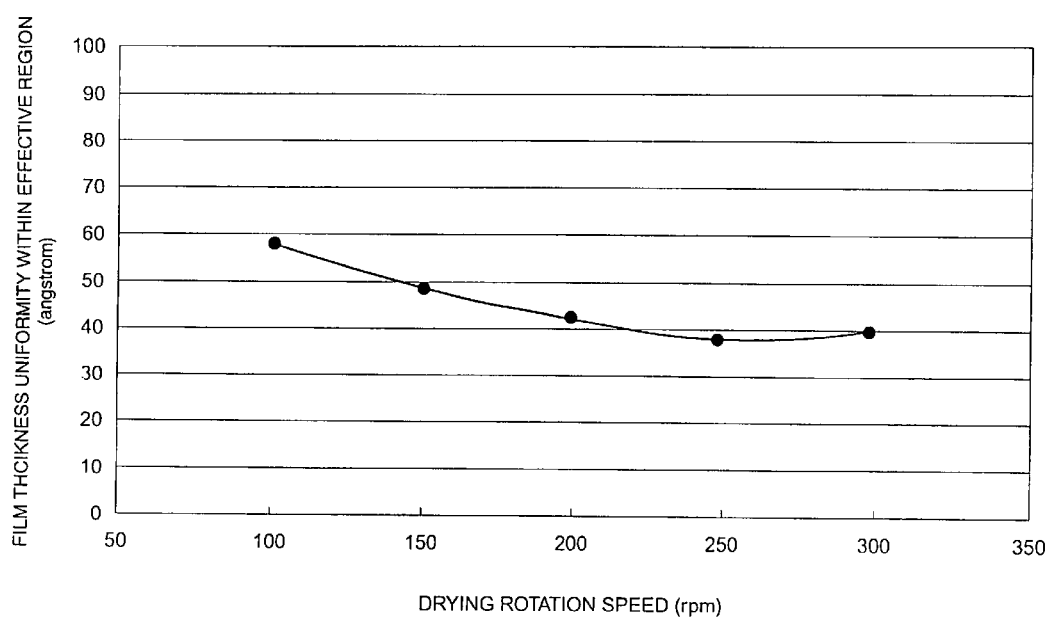
FIG. 15 is a diagram showing the relationship between the film thickness uniformity within the effective region and the drying rotation speed according to an embodiment of the present invention.

As is clear from FIG. 15, maximum film thickness uniformity within the effective region can be achieved at the drying rotation speed (drying rotation condition IV) of 250 rpm.

Subsequently, the resist concentration was optimized. As described above, almost no change occurs in the condition of combination of the main rotation speed and the main rotation time for achieving maximum film thickness uniformity within the effective region in the contour map representing the distribution of the film thickness uniformity within the effective region even when the resist concentration is changed. Furthermore, almost no change occurs in the condition of combination of the main rotation speed and the main rotation time for achieving maximum film thickness uniformity within the effective region in the contour map representing the distribution of the film thickness uniformity within the effective region even when the drying rotation speed is changed. In consideration of these facts, the resist concentration was optimized as described below.

FEP171 having a resist concentration of 8.5% was diluted with a mixed solution of PGMEA (propylene glycol monomethyl ether acetate) and PGME (propylene glycol monomethyl ether) at a ratio of 8 to 2. This mixed solution was the solvent in FEP171. Ratios of the undiluted solution (8.5%) to the amount of addition of the solvent (dilution ratios) were specified to be 10 to 0, 10 to 1, 10 to 2, 10 to 3, 10 to 4, 10 to 5 and 10 to 10 (1 to 1), and therefore, diluted solutions were prepared.

Each of the above mentioned 7 sorts of diluted solution was applied onto a substrate 6 inches square having a thickness of 0.25 inches while a main rotation speed was fixed at 1,500 rpm, a main rotation time was fixed at 2 seconds, and a drying rotation speed was fixed at 250 rpm, so that a sample substrate was prepared. The mean film thicknesses of each sample substrate were measured by the method described above, and the relationship (graph) between the mean film thickness and the resist concentration was determined (FIG. 16).

Figure 16:
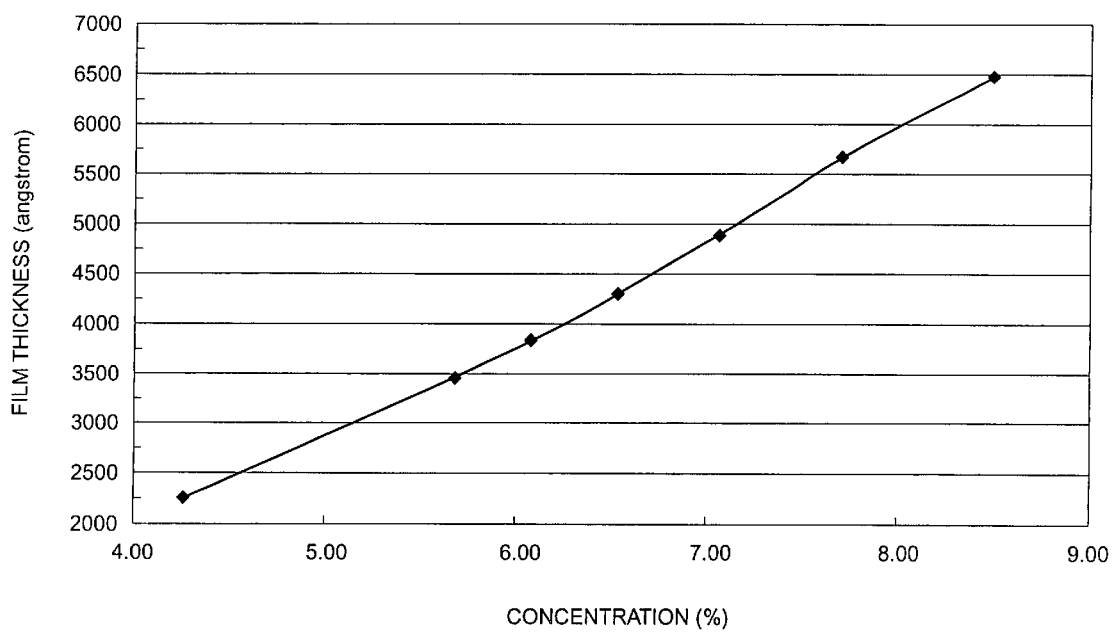
FIG. 16 is a diagram showing the relationship between the resist film thickness and the resist concentration in an embodiment of the present invention.

As is clear from FIG. 16, when the dilution ratio is specified to be 100 to 20 (that is, the resist concentration condition V' is specified to be about 7.08%), a desirably specified film thickness of 5,000 angstroms can be achieved. When the dilution ratio is specified to be 100 to 65 (that is, the resist concentration condition V' is specified to be about 5.15%), another desirably specified film thickness of 3,000 angstroms can be achieved.

An FEP171 solution was adjusted to have a resist concentration of about 7.08%. Coating was performed onto a substrate 6 inches square having a thickness of 0.25 inches while a main rotation speed was fixed at 1,500 rpm, a main rotation time was fixed at 2 seconds, and a drying rotation speed was fixed at 250 rpm. A baking treatment was performed after the coating, and therefore, a sample substrate was prepared.

Regarding the above mentioned sample substrate, the coating film thicknesses were measured at 121 points uniformly located all over an effective region (132 mm×132 mm) on the substrate with a spectroscopic reflection type thicknessmeter (AFT6100M manufactured by Nanometrics Japan LTD.). Subsequently, the mean film thickness (a mean value calculated from film thickness data at individual measurement points) and film thickness uniformity within the effective region (a range value calculated from film thickness data at individual measurement points) were determined from the measurement results. Results of film thickness uniformity within the effective region was 38 angstroms when the mean film thickness was 5,003 angstroms.

An FEP171 solution was adjusted to have a resist concentration of about 5.15%. Coating was performed onto a substrate 6 inches square having a thickness of 0.25 inches while a main rotation speed was fixed at 1,500 rpm, a main rotation time was fixed at 2 seconds, and a drying rotation speed was fixed at 250 rpm. A baking treatment was performed after the coating, and therefore, a sample substrate was prepared. Regarding the above mentioned sample substrate, the coating film thicknesses were measured at 121 points uniformly located all over an effective region (132 mm×132 mm) on the substrate with a spectroscopic reflection type thicknessmeter (AFT6100M manufactured by Nanometrics Japan LTD.). Subsequently, the mean film thickness (a mean value calculated from film thickness data at individual measurement points) and film thickness uniformity within the effective region (a range value calculated from film thickness data at individual measurement points) were determined from the measurement results. Results of film thickness uniformity within the effective region was 28 angstroms when the mean film thickness was 3,005 angstroms.

It is also clear from the above mentioned two results that the film thickness uniformity within the effective region is improved with respect to the sample having a lower resist concentration (the sample having a smaller mean resist film thickness).

As is clear from the above mentioned results, the condition I of the main rotation speed and the main rotation time is selectively fixed by the determination method for the main rotation condition according to the first aspect or the second aspect, the condition IV of the drying rotation speed is selectively fixed by the determination method for the drying condition according to the fifth aspect, and the condition V' of concentration of the resist solution is selectively fixed by the determination method for the concentration of the resist solution according to the seventh aspect. Resist-coating is performed in accordance with the condition I, condition IV and condition V'. Consequently, each condition can be univocally determined, and maximum film thickness uniformity within the effective region can be achieved.

The present invention is not limited to the above description. It is needless to say that in the present invention, the above mentioned reference data A, the contour map or the bird's eye view can be prepared in consideration of the results of optimization of the resist concentration, the drying rotation speed and the like.

It is needless to say that in the present invention, the above mentioned reference data A, the contour map or the bird's eye view can be prepared with respect to various sorts of resist solution The uniformity of the resist film thickness achieved by the spin-coating method is affected by the resist species, the solvent, the shape of a cup of a coating device, the amount of exhaust or the like. Consequently, when the uniformity of the resist film thickness is improved by improvements of these conditions, coating can be performed with film thickness uniformity within the effective region higher than the film thickness uniformity within the effective region exemplified in the above description by combining these conditions with the present invention.

The size and the shape of the substrate are not limited to the substrate 6 inches square.

In the present invention, the region for measurement of the resist film is not specifically limited as long as the region is in the substrate. However, desirably, the measurement is performed in an effective region because a pattern (e.g. a mask pattern and a circuit pattern) and the like is formed in that region on the substrate. In order to precisely prepare the contour map or the bird's eye view, desirably, measurement is performed at the maximum number of points spaced at regular intervals all over the effective range.

In the present invention, the resist film thickness can be measured using, for example, spectroscopic reflection type thicknessmeters and contact probe type thicknessmeters. Regarding the measurement of the film thickness uniformity within the effective region of each sample substrate of the above mentioned resist film, the measurement was performed using these spectroscopic reflection type thicknessmeters.

In the present invention, the effective region on the substrate can be appropriately selected in accordance with required specifications. For example, in the case of a photomask blank or a phase shifting mask blank in which a substrate is a square-like (square or rectangular) substrate, a region for arrangement of a mask pattern is selected. This is because a desirably specified patterning characteristic (pattern dimension precision) cannot be achieved when the film thickness uniformity within the effective region of the resist film exceeds a predetermined value in the region for arrangement of a mask pattern. For example, when the size of the substrate is 6 inches by 6 inches, the effective region is specified to be a square of 132 mm by 132 mm in the midsection of the substrate, and a mask pattern is formed therein. When desirably specified film thickness uniformity within the effective region must be ensured in a region for arrangement of an alignment mark outside the region for arrangement of the mask pattern or a region for arrangement of an auxiliary pattern, e.g. a QA pattern indicating quality assurance of the mask, an effective region of measurement of the film thickness uniformity within the effective region of each sample substrate is specified in accordance with those regions.

Figure 12A:
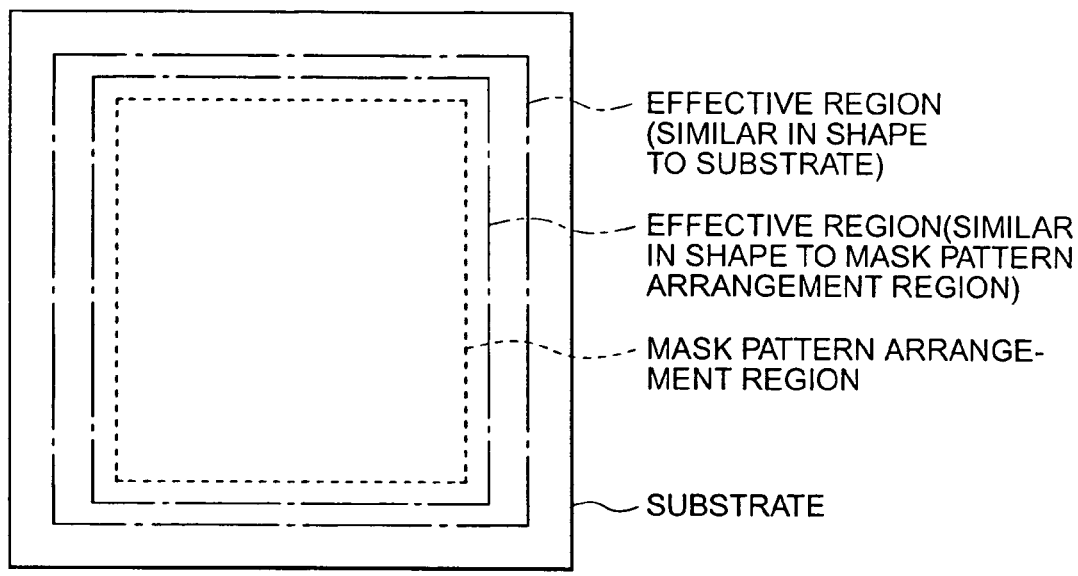
FIGS. 12A and 12B are schematic diagrams for illustrating effective regions in the case of square-like (square or rectangular) substrates.
Figure 12B:
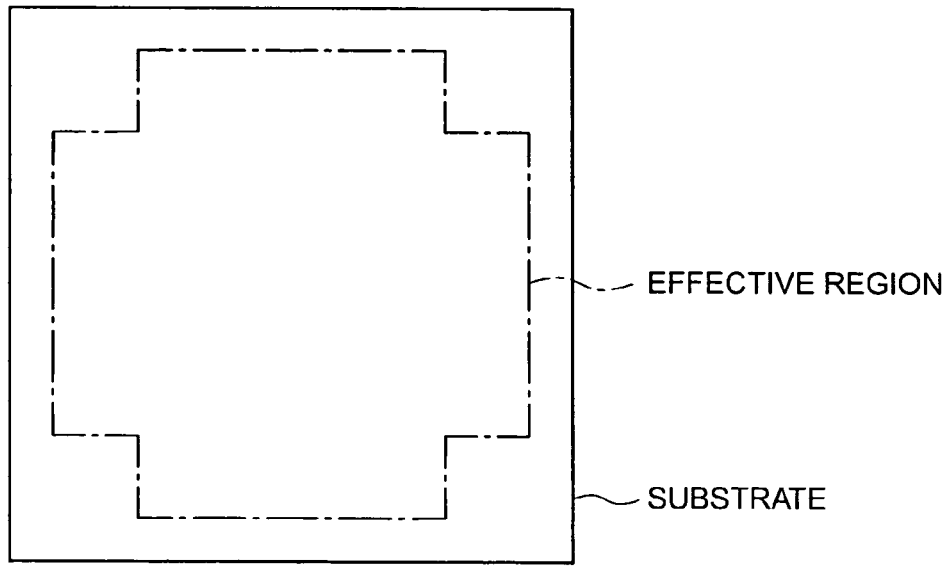

When the region for arrangement of the mask pattern is in the shape of a square, the above mentioned desirably specified effective region is specified to be in the shape of a quadrangle (the shape similar to the region for arrangement of the mask pattern, the shape similar to the square-like (square or rectangular) substrate and the like), as shown in FIG. 12A. On the other hand, when the region for arrangement of the mask pattern is in the shape of a rectangle, the desirably specified effective region is specified to be in the shape of a cross adjusted to exclude the four corner portions, as shown in FIG. 12B.

In general, when change occurs in the desirably specified effective region for measuring the film thickness distribution within the effective region (critical area) of the measurment (film thickness uniformity within an effective region) of the resist film, change also occurs in the film thickness distribution within the effective region (critical area) of the measurment, and therefore, the film thickness distribution within the effective region (critical area) of the measurment (film thickness uniformity within an effective region) must be measured on a required specification basis.

In the present invention, predetermined film thickness uniformity within the effective region can be appropriately selected in accordance with a required specification. The lower limit value of the film thickness uniformity within the effective region is restricted by a resist species, a desirably specified film thickness, a resist-coating device, limits of measurement of the film thickness distribution within the effective region (critical area) of the measurment (film thickness uniformity within the effective region) and the like, and therefore, is appropriately selected in accordance therewith.

The mask blank referred to in the present invention includes a photomask blank and a phase shifting mask blank. The mask blank referred to in the present invention includes a blank with a resist film, as well as a mask blank including a resist film, a resist bottom anti-reflective coating, a resist top anti-reflective layer, a resist top protective film, a conductive film, other coating film, an arbitrary combination thereof or the like, and a blank before arrangement of these films. The mask referred to in the present invention includes a photomask and a phase shifting mask. The mask referred to in the present invention includes a reticle.

The present invention includes the following modified aspects. The present invention is also applied to a spin-coating method including a uniforming step of dispensing a coating solution on a substrate and rotating the substrate at a predetermined main rotation speed for a predetermined main rotation time, so as to primarily make the coating film thickness uniform, and a drying step of rotating the substrate at a predetermined drying rotation speed for a predetermined drying rotation time after the uniforming step, so as to primarily dry the uniform coating film.

First Modified Aspect

The first modified aspect will be described below. In the above mentioned spin-coating method, a plurality of samples are prepared by being coated with the coating solution under a plurality of conditions resulting from independent, stepwise change in parameters in the uniforming step, while the parameters are the main rotation speed and the main rotation time, and under the condition in which the concentration (viscosity) of the coating solution is fixed at an arbitrary concentration, and the drying rotation speed in the drying step is fixed at an arbitrary rotation speed. The coating film thicknesses of each sample are measured at a plurality of points within a desirably specified effective region in the substrate, and film thickness uniformity within the effective region is determined from results of film thickness distribution [range (maximum minus minimum) value or standard deviation value], within the effective region (critical area) of the measurment. The relationship is thereby determined between the condition of combination of the main rotation speed and the main rotation time of each sample and the film thickness uniformity within the effective region of each sample, and this relationship is specified to be reference data A. A condition I of combination of the main rotation speed and the main rotation time for achieving desirably specified film thickness uniformity within the effective region is determined based on the reference data A, and application of the coating solution is performed in accordance with results of condition I of combination of the main rotation speed and the main rotation time.

Second Modified Aspect

In the second modified aspect, the reference data A is a contour map in which the vertical axis indicates the main rotation speed, the horizontal axis indicates the main rotation time, and points corresponding to the same film thickness uniformity within the effective region are bonded by a contour line, or a bird's eye view drawn by point-plotting while the X axis, the Y axis and the Z axis indicate the main rotation speed, the main rotation time and the film thickness uniformity within the effective region, respectively.

Third Modified Aspect

In the third modified aspect, a plurality of reference data A according to the above mentioned first modified aspect or contour maps or bird's eye views according to the above mentioned second modified aspect are determined based on stepwise change in the concentration (viscosity) of the coating solution, the condition II of concentration (viscosity) of the coating solution for achieving maximum film thickness uniformity within the effective region is determined among the group consisting of the plural reference data A, the group consisting of the plural contour maps or the group consisting of the plural bird's eye views, and application of the coating solution is performed in accordance with results of condition II of concentration (viscosity) of the coating solution.

Fourth Modified Aspect

In the fourth modified aspect, a plurality of reference data A according to the above mentioned first modified aspect or contour maps or bird's eye views according to the above mentioned second modified aspect are determined based on stepwise change in the drying rotation speed in the drying step while the concentration (viscosity) of the coating solution is fixed at an arbitrary concentration, the condition III of drying rotation speed for achieving maximum film thickness uniformity within the effective region is determined among the group consisting of the plural reference data A, the group consisting of the plural contour maps or the group consisting of the plural bird's eye views, and application of the coating solution is performed in accordance with results of condition III of drying rotation speed.

Fifth Modified Aspect

In the fifth modified aspect, a plurality of samples are prepared by being coated with the coating solution under a plurality of conditions resulting from stepwise change in the drying rotation speed in the drying step and under the condition in which the main rotation speed and the main rotation time in the uniforming step are fixed at the condition I of the main rotation speed and the main rotation time determined according to the above mentioned first modified aspect. The coating film thicknesses of each sample are measured at a plurality of points within a desirably specified effective region in the substrate, and film thickness uniformity within the effective region is determined from results of film thickness distribution [range (maximum minus minimum) value or standard deviation value], within the effective region (critical area) of the measurment. The relationship is thereby determined between the drying rotation speed of each sample and the film thickness uniformity within the effective region of each sample, and this relationship is specified to be reference data B. A condition IV of the drying rotation speed for achieving maximum (best) film thickness uniformity within the effective region is determined based on the reference data B, and application of the coating solution is performed in accordance with results of condition IV of the drying rotation speed.

Sixth Modified Aspect

In the sixth modified aspect, a plurality of samples are prepared by being coated with the coating solution under a plurality of conditions resulting from stepwise change in the concentration (viscosity) of the coating solution and under the condition in which the main rotation speed and the main rotation time in the uniforming step are fixed at the condition I of the main rotation speed and the main rotation time determined according to the above mentioned first modified aspect. The resist film thicknesses of each sample are measured at a plurality of points within a desirably specified effective region in the substrate, and a mean value of results of coating film thicknesses is determined. The relationship is thereby determined between the concentration (viscosity) of the coating solution of each sample and the mean value of the coating film thicknesses of each sample, and this relationship is specified to be reference data C. A condition of V of concentration (viscosity) of the coating solution for achieving a desirably specified mean coating film thickness is determined based on the reference data C, and application of the coating solution is performed in accordance with results of condition of V of concentration (viscosity) of the coating solution.

Seventh Modified Aspect

In the seventh modified aspect of the present invention, a plurality of samples are prepared by being coated with the coating solution under a plurality of conditions resulting from stepwise change in the concentration (viscosity) of the coating solution and under the condition in which the main rotation speed and the main rotation time in the uniforming step are fixed at the condition I of the main rotation speed and the main rotation time determined according to the above mentioned first modified aspect, and the drying rotation speed in the drying step is fixed at the condition IV of the drying rotation speed determined according to the above mentioned fifth modified aspect. The coating film thicknesses of each sample are measured at a plurality of points within a desirably specified effective region in the substrate, and a mean value of results of coating film thicknesses is determined. The relationship is thereby determined between the concentration (viscosity) of the coating solution of each sample and the mean value of the coating film thicknesses of each sample, and this relationship is specified to be reference data C'. A condition of V' of concentration (viscosity) of the coating solution for achieving a desirably specified mean coating film thickness is determined based on the reference data C', and application of coating solution is performed in accordance with results of condition of V' of concentration (viscosity) of the coating solution.

Eighth Modified Aspect

In the eighth modified aspect, the main rotation speed and the main rotation time are selectively fixed at the condition I by the determination method for the main rotation condition according to the above mentioned first modified aspect or the above mentioned second modified aspect. The drying rotation speed is selectively fixed at the condition IV by the determination method for the drying rotation condition according to the above mentioned fifth modified aspect. The concentration (viscosity) of the coating solution is selectively fixed at the condition V' by the determination method for the concentration (viscosity) of the coating solution according to the above mentioned seventh modified aspect. Subsequently, application of the coating solution is performed in accordance with the condition I, condition IV and condition V'.

Ninth Modified Aspect

In the spin-coating method according to the above mentioned fourth modified aspect, the condition III of drying rotation speed is determined from the group consisting of the plural reference data, the group consisting of the plural contour maps or the group consisting of the plural bird's eye views. The drying rotation speed condition is selected in order that fluctuations in the film thickness uniformity within the effective region becomes small and stable with respect to fluctuations in the main rotation speed and/or the main rotation time in a practical coating process relative to the setting values or with respect to fluctuations in the concentration (viscosity) of the coating solution for achieving the desirably specified mean coating film thickness, and application of the coating solution is performed in accordance with results of condition.

Tenth Modified Aspect

In the spin-coating method according to the above mentioned fourth modified aspect, the condition III of drying rotation speed is determined from the group consisting of the plural reference data, the group consisting of the plural contour maps or the group consisting of the plural bird's eye views. The condition III of drying rotation speed is selected in order that when plural thicknesses of coatings are applied using a coating solution having the same concentration (viscosity), the plural thicknesses of coatings can be applied while the film thickness uniformity within the effective region is within a constant range, and application of the coating films is performed in accordance with results of condition III, so as to achieve a plurality of thicknesses.

Eleventh Modified Aspect

In any one of the above mentioned first to tenth modified aspects, a square-like (square or rectangular) substrate is used as the substrate.

Twelfth Modified Aspect

The spin-coating condition is determined based on at least one of the reference data determined in the spin-coating methods according to the above mentioned first to seventh modified aspects.

Thirteenth Modified Aspect

A mask blank is provided and includes a coating film on a substrate. The substrate includes at least an opaque layer and/or a phase shifting layer having an opaque function. The coating film is formed by the spin-coating method according to any one of the above mentioned first to eleventh modified aspects.

Fourteenth Modified Aspect

A substrate including a coating film is provided. The coating film is formed by the spin-coating method according to any one of the above mentioned first to eleventh modified aspects.

In the above mentioned first to thirteenth modified aspects, examples of the coating film include, for example, a resist film, a resist bottom anti-reflective coating, a resist top anti-reflective layer, a resist top protective film, a conductive film, other coating films, a film of an arbitrary combination thereof. The coating solution is a solution for forming these coating films.

In the spin-coating method for applying resist solution or other coating solution by spin coating through the above mentioned specific method, the present invention can provide a technique for optimizing a main rotation condition, a technique for optimizing a drying rotation condition and a technique for optimizing a concentration (viscosity) condition of resist solution or other coating solution. The present invention can also provide a technique for reliably (univocally) determining these optimum conditions without depending on trial-and-error methods.

The optimum condition of the resist spin-coating can be speedily, univocally determined without depending on trial-and-error methods, even when any condition in the spin coating is changed, for example, a resist species or other coating solution is changed (including change in solvent), a desirably specified effective region (critical area) is changed, a desirably specified film thickness is changed, and a spin-coating device (e.g. the shape of a cup and the shape of a chuck) is changed.

Regarding a predetermined resist species or other coating solution, a determination method for a spin-coating condition and a spin-coating method can be provided, while the methods can reliably (univocally) achieve desirably specified film thickness uniformity within the effective region (in particular, maximum film thickness uniformity within the effective region) in a desirably specified effective region without depending on trial-and-error methods. In addition, a mask blank (photomask blank) or a substrate can be provided and includes a resist film, etc., or other coating film formed by this method.

Regarding a predetermined resist species or other coating solution, a determination method for a spin-coating condition and a spin-coating method are provided, while the methods can reliably (univocally) achieve a desirably specified film thickness (mean) and desirably specified film thickness uniformity within the effective region in a desirably specified effective region without depending on trial-and-error methods. In addition, a mask blank (photomask blank) or a substrate can be provided and includes a resist film, etc., or other coating film formed by this method.

A determination method for a spin-coating condition and a spin-coating method can be provided, while the methods can reliably determine an optical spin-coating condition in accordance with the characteristics of a resist species or other coating solution without depending on trial-and-error methods. In addition, a mask blank (photomask blank) or a substrate can be provided and includes a resist film, etc., or other coating film formed by this method.

Furthermore, a spin-coating method can be provided. The method can apply resist solution having one concentration or other coating solution having one concentration in such a manner that plural sorts of desirably specified resist film thickness or plural sorts of desirably specified coating film thickness can be achieved while the film thickness uniformity within the effective region is within a predetermined range.

What is claimed is:

1. A mask blank comprising:

a substrate, a resist film on said substrate, wherein the substrate includes at least an opaque layer and/or a phase-shifting layer, or phase-shifting layer having an opaque function, and the resist film is formed by the spin-coating method comprising:

a uniforming (evening or flatting) step of dispensing a resist solution on a substrate and rotating said substrate at a predetermined main rotation speed for a predetermined main rotation time, so as to primarily make a resist film thickness uniform; and a drying step of rotating said substrate at a predetermined drying rotation speed for a predetermined drying rotation time after said uniforming step, so as to primarily dry said uniform resist film, wherein a plurality of samples are prepared by being coated with the resist solution under a plurality of conditions resulting from independent, stepwise change in parameters in said uniforming step, the parameters being said main rotation speed and said main rotation time, and under the condition in which the concentration (viscosity) of the resist solution is fixed at an arbitrary concentration, and the drying rotation speed in said drying step is fixed at an arbitrary rotation speed, wherein the resist film thicknesses of each sample are measured at a plurality of points within a desirably specified effective region (critical area) in said substrate, film thickness uniformity within an effective region is determined from results of film thickness uniformity distribution within the effective region, the relationship is thereby determined between a condition of combination of the main rotation speed and the main rotation time of each sample and the film thickness uniformity within the effective region on each sample, and this relationship is specified to be reference data A, wherein a condition I of combination of the main rotation speed and the main rotation time for achieving desirably specified film thickness uniformity within the effective region is determined based on said reference data A, and wherein resist-coating is performed in accordance with the condition I of combination of the main rotation speed and the main rotation time, wherein the film thickness uniformity within the effective region of 132 mm by 132 mm in the midsection of the substrate is not greater than 20–30 angstroms or 30–40 angstroms.

2. A mask blank comprising:

a substrate, a resist film on said substrate, wherein the substrate includes at least an opaque layer and/or a phase-shifting layer, or phase-shifting layer having an opaque function, and the resist film is formed by the spin-coating method comprising:

a uniforming (evening or flatting) step of dispensing a resist solution on a substrate and rotating said substrate at a predetermined main rotation speed for a predetermined main rotation time, so as to primarily make the resist film thickness uniform; and a drying step of rotating said substrate at a predetermined drying rotation speed for a predetermined drying rotation time after said uniforming step, so as to primarily dry said uniform resist film, wherein a plurality of samples are prepared by being coated with the resist solution under a plurality of conditions resulting from independent, stepwise change in parameters in said uniforming step, the parameters being said main rotation speed and said main rotation time, and under the condition in which the concentration (viscosity) of the resist solution is fixed at an arbitrary concentration, and the drying rotation speed in said drying step is fixed at an arbitrary rotation speed, wherein the resist film thicknesses of each sample are measured at a plurality of points within a desirably specified effective region (critical area) in said substrate, film thickness uniformity within an effective region is determined from results of film thickness uniformity distribution within the effective region, the relationship is thereby determined between a condition of combination of the main rotation speed and the main rotation time of each sample and the film thickness uniformity within the effective region on each sample, and this relationship is specified to be reference data A, wherein a plurality of reference data A are determined based on stepwise change in the concentration (viscosity) of the resist solution, and a condition II of concentration (viscosity) of the resist solution for achieving the maximum film thickness uniformity within the effective region is determined among a group consisting of the plural reference data A, and wherein resist-coating is performed in accordance with the condition II of concentration (viscosity) of the resist solution, wherein the film thickness uniformity within the effective region of 132 mm by 132 mm in the midsection of the substrate is not greater than 20–30 angstroms or 30–40 angstroms.

3. A mask blank according to claim 2, wherein said reference data A is a contour map in which the vertical axis indicates said main rotation speed, the horizontal axis indicates said main rotation time, and points corresponding to the same film thickness uniformity within the effective region are connected by a contour line, or is a bird's eye view drawn by point-plotting where the X axis, the Y axis and the Z axis indicate said main rotation speed, said main rotation time and said film thickness uniformity within the effective region, respectively, and wherein a plurality of contour maps or bird's eye views are determined based on stepwise change in the concentration (viscosity) of the resist solution, and said condition II of concentration (viscosity) of the resist solution for achieving the maximum film thickness uniformity within the effective region is determined among a group consisting of the plural contour maps or a group consisting of the plural bird's eye views.

4. A mask blank comprising:

a substrate, a resist film on said substrate, wherein the substrate includes at least an opaque layer and/or a phase-shifting layer, or phase-shifting layer having an opaque function, and the resist film is formed by the spin-coating method comprising:

a uniforming (evening or flatting) step of dispensing a resist solution on a substrate and rotating said substrate at a predetermined main rotation speed for a predetermined main rotation time, so as to primarily make the resist film thickness uniform; and a drying step of rotating said substrate at a predetermined drying rotation speed for a predetermined drying rotation time after said uniforming step, so as to primarily dry said uniform resist film, wherein a plurality of samples are prepared by being coated with the resist solution under a plurality of conditions resulting from independent, stepwise change in parameters in said uniforming step, the parameters being said main rotation speed and said main rotation time, and under the condition in which the concentration (viscosity) of the resist solution is fixed at an arbitrary concentration, and the drying rotation speed in said drying step is fixed at an arbitrary rotation speed, wherein the resist film thicknesses of each sample are measured at a plurality of points within a desirably specified effective region (critical area) in said substrate, film thickness uniformity within an effective region is determined from results of film thickness uniformity distribution within the effective region, the relationship is thereby determined between a condition of combination of the main rotation speed and the main rotation time of each sample and the film thickness uniformity within the effective region on each sample, and this relationship is specified to be reference data A, wherein a plurality of reference data A are determined based on stepwise change in the drying rotation speed in said drying step when the concentration (viscosity) of the resist solution is fixed at an arbitrary concentration, and a condition III of drying rotation speed for achieving the maximum film thickness uniformity within the effective region is determined among a group consisting of the plural reference data, and wherein resist-coating is performed in accordance with the condition III of the drying rotation speed, wherein the film thickness uniformity within the effective region of 132 mm by 132 mm in the midsection of the substrate is not greater than 20–30 angstroms or 30–40 angstroms.

5. A mask blank according to claim 4, wherein said reference data A is a contour map in which the vertical axis indicates said main rotation speed, the horizontal axis indicates said main rotation time, and points corresponding to the same film thickness uniformity within the effective region are connected by a contour line, or is a bird's eye view drawn by point-plotting where the X axis, the Y axis and the Z axis indicate said main rotation speed, said main rotation time and said film thickness uniformity within the effective region, respectively, and wherein a plurality of contour maps or bird's eye views are determined based on stepwise change in the drying rotation speed in said drying step when the concentration (viscosity) of the resist solution is fixed at an arbitrary concentration, and said condition III of drying rotation speed for achieving the maximum film thickness uniformity within the effective region is determined among a group consisting of the contour maps or a group consisting of the bird's eye views.

6. A mask blank comprising:

a substrate, a resist film on said substrate, wherein the substrate includes at least an opaque layer and/or a phase-shifting layer, or phase-shifting layer having an opaque function, and the resist film is formed by the spin-coating method comprising:

a uniforming (evening or flatting)step of dispensing a resist solution on a substrate and rotating said substrate at a predetermined main rotation speed for a predetermined main rotation time, so as to primarily make the resist film thickness uniform; and a drying step of rotating said substrate at a predetermined drying rotation speed for a predetermined drying rotation time after said uniforming step, so as to primarily dry said uniform resist film, wherein a plurality of samples are prepared by being coated with the resist solution under a plurality of conditions resulting from independent, stepwise change in parameters in said uniforming step, the parameters being said main rotation speed and said main rotation time, and under the condition in which the concentration (viscosity) of the resist solution is fixed at an arbitrary concentration, and the drying rotation speed in said drying step is fixed at an arbitrary rotation speed, wherein the resist film thicknesses of each sample are measured at a plurality of points within a desirably specified effective region (critical area) in said substrate, film thickness uniformity within an effective region is determined from results of film thickness uniformity distribution within the effective region, the relationship is thereby determined between a condition of combination of the main rotation speed and the main rotation time of each sample and the film thickness uniformity within the effective region on each sample, and this relationship is specified to be reference data A, wherein a condition I of combination of the main rotation speed and the main rotation time for achieving desirably specified film thickness uniformity within the effective region is determined based on said reference data A, wherein a plurality of samples are prepared by being coated with the resist under a plurality of conditions resulting from stepwise change in the drying rotation speed in said drying step and under the condition in which said main rotation speed and said main rotation time in said uniforming step are fixed at the determined condition I of the main rotation speed and the main rotation time, wherein the resist film thicknesses of each sample are measured at a plurality of points within a desirably specified effective region in said substrate, film thickness uniformity within the effective region is determined from results of the film thickness uniformity distribution within the effective region, the relationship is thereby determined between the drying rotation speed of each sample and the film thickness uniformity within the effective region on each sample, and this relationship is specified to be reference data B, wherein a condition IV of drying rotation speed for achieving the maximum film thickness uniformity within the effective region is determined based on said reference data B, and wherein resist-coating is performed in accordance with the condition IV of the drying rotation speed, wherein the film thickness uniformity within the effective region of 132 mm by 132 mm in the midsection of the substrate is not greater than 20–30 angstroms or 30–40 angstroms.

7. A mask blank comprising:

a substrate, a resist film on said substrate, wherein the substrate includes at least an opaque layer and/or a phase-shifting layer, or phase-shifting layer having an opaque function, and the resist film is formed by the spin-coating method comprising:

a uniforming (evening or flatting)step of dispensing a resist solution on a substrate and rotating said substrate at a predetermined main rotation speed for a predetermined main rotation time, so as to primarily make the resist film thickness uniform; and a drying step of rotating said substrate at a predetermined drying rotation speed for a predetermined drying rotation time after said uniforming step, so as to primarily dry said uniform resist film, wherein a plurality of samples are prepared by being coated with the resist solution under a plurality of conditions resulting from independent, stepwise change in parameters in said uniforming step, the parameters being said main rotation speed and said main rotation time, and under the condition in which the concentration (viscosity) of the resist solution is fixed at an arbitrary concentration, and the drying rotation speed in said drying step is fixed at an arbitrary rotation speed, wherein the resist film thicknesses of each sample are measured at a plurality of points within a desirably specified effective region (critical area) in said substrate, film thickness uniformity within an effective region is determined from results of film thickness uniformity distribution within the effective region, the relationship is thereby determined between a condition of combination of the main rotation speed and the main rotation time of each sample and the film thickness uniformity within the effective region on each sample, and this relationship is specified to be reference data A, wherein a condition I of combination of the main rotation speed and the main rotation time for achieving desirably specified film thickness uniformity within the effective region is determined based on said reference data A, wherein a plurality of samples are prepared by being coated with the resist under a plurality of conditions resulting from stepwise change in the concentration (viscosity) of the resist solution and under the condition in which said main rotation speed and said main rotation time in said uniforming step are fixed at the determined condition I, wherein the resist film thicknesses of each sample are measured at a plurality of points within a desirably specified effective region in said substrate, a mean value of results of resist film thicknesses measurements is determined, the relationship is thereby determined between the concentration (viscosity) of the resist solution of each sample and the mean value of the resist film thicknesses of each sample, and this relationship is specified to be reference data C, wherein a condition V of concentration (viscosity) of the resist solution for achieving a desirably specified resist film thickness mean is determined based on said reference data C, and wherein resist-coating is performed in accordance with the condition V of concentration (viscosity) of the resist solution, wherein the film thickness uniformity within the effective region of 132 mm by 132 mm in the midsection of the substrate is not greater than 20–30 angstroms or 30–40 angstroms.

8. A mask blank comprising:

a substrate, a resist film on said substrate, wherein the substrate includes at least an opaque layer and/or a phase-shifting layer, or phase-shifting layer having an opaque function, and the resist film is formed by the spin-coating method comprising:

a uniforming (evening or flatting) step of dispensing a resist solution ort a substrate and rotating said substrate at a predetermined main rotation speed for a predetermined main rotation time, so as to primarily make a resist film thickness uniform; and a drying step of rotating said substrate at a predetermined drying rotation speed for a predetermined drying rotation time after said uniforming step, so as to primarily dry said uniform resist film, wherein a plurality of samples are prepared by being coated with the resist solution under a plurality of conditions resulting from independent, stepwise change in parameters in said uniforming step, the parameters being said main rotation speed and said main rotation time, and under the condition in which the concentration (viscosity) of the resist solution is fixed at an arbitrary concentration, and the drying rotation speed in said drying step is fixed at an arbitrary rotation speed, wherein the resist film thicknesses of each sample are measured at a plurality of points within a desirably specified effective region (critical area) in said substrate, film thickness uniformity within an effective region is determined from results of film thickness uniformity distribution within the effective region, the relationship is thereby determined between a condition of combination of the main rotation speed and the main rotation time of each sample and the film thickness uniformity within the effective region on each sample, and this relationship is specified to be reference data A, wherein a condition I of combination of the main rotation speed and the main rotation time for achieving desirably specified film thickness uniformity within the effective region is determined based on said reference data A, wherein a plurality of samples are prepared by being coated with the resist under a plurality of conditions resulting from stepwise change in the drying rotation speed in said drying step and under the condition in which said main rotation speed and said main rotation time in said uniforming step are fixed at the determined condition I of the main rotation speed and the main rotation time, wherein the resist film thicknesses of each sample are measured at a plurality of points within a desirably specified effective region in said substrate, film thickness uniformity within the effective region is determined from results of the film thickness uniformity distribution within the effective region, the relationship is thereby determined between the drying rotation speed of each sample and the film thickness uniformity within the effective region on each sample, and this relationship is specified to be reference data B, wherein a condition IV of drying rotation speed for achieving the maximum film thickness uniformity within the effective region is determined based on said reference data B, wherein a plurality of samples are prepared by being coated with the resist under a plurality of conditions resulting from stepwise change in the concentration (viscosity) of the resist solution and under the condition in which said main rotation speed and said main rotation time in said uniforming step are fixed at the determined condition I of the main rotation speed and the main rotation time, and the drying rotation speed in said drying step is fixed at the condition IV of drying rotation speed, wherein the resist film thicknesses of each samples are measured at a plurality of points within a desirably specified effective region in said substrate, a mean value of the results of resist film thicknesses measurements is determined, the relationship is thereby determined between the concentration (viscosity) of the resist solution of each sample and the mean value of the resist film thicknesses of each sample, and this relationship is specified to be reference data C', wherein a condition V' of concentration (viscosity) of the resist solution for achieving a desirably specified resist film thickness mean is determined based on said reference data C', and wherein resist-coating is performed in accordance with the condition V' of concentration (viscosity) of the resist solution, wherein the film thickness uniformity within the effective region of 132 mm by 132 mm in the midsection of the substrate is not greater than 20–30 angstroms or 30–40 angstroms.

9. A mask blank comprising:

a substrate, a resist film on said substrate, wherein the substrate includes at least an opaque layer and/or a phase-shifting layer, or phase-shifting layer having an opaque function, and the resist film is formed by the spin-coating method comprising:

a uniforming (evening or flatting) step of dispensing a resist solution ort a substrate and rotating said substrate at a predetermined main rotation speed for a predetermined main rotation time, so as to primarily make a resist film thickness uniform; and a drying step of rotating said substrate at a predetermined drying rotation speed for a predetermined drying rotation time after said uniforming step, so as to primarily dry said uniform resist film, wherein a plurality of samples are prepared by being coated with the resist solution under a plurality of conditions resulting from independent, stepwise change in parameters in said uniforming step, the parameters being said main rotation speed and said main rotation time, and under the condition in which the concentration (viscosity) of the resist solution is fixed at an arbitrary concentration, and the drying rotation speed in said drying step is fixed at an arbitrary rotation speed, wherein the resist film thicknesses of each sample are measured at a plurality of points within a desirably specified effective region (critical area) in said substrate, film thickness uniformity within an effective region is determined from results of film thickness uniformity distribution within the effective region, the relationship is thereby determined between a condition of combination of the main rotation speed and the main rotation time of each sample and the film thickness uniformity within the effective region on each sample, and this relationship is specified to be reference data A, wherein a condition I of combination of the main rotation speed and the main rotation time for achieving desirably specified film thickness uniformity within the effective region is determined based on said reference data A, wherein a plurality of samples are prepared by being coated with the resist under a plurality of conditions resulting from stepwise change in the drying rotation speed in said drying step and under the condition in which said main rotation speed and said main rotation time in said uniforming step are fixed at the determined condition I of the main rotation speed and the main rotation time, wherein the resist film thicknesses of each sample are measured at a plurality of points within a desirably specified effective region in said substrate, film thickness uniformity within the effective region is determined from results of the film thickness uniformity distribution within the effective region, the relationship is thereby determined between the drying rotation speed of each sample and the film thickness uniformity within the effective region on each sample, and this relationship is specified to be reference data B, wherein a condition IV of drying rotation speed for achieving the maximum film thickness uniformity within the effective region is determined based on said reference data B, wherein a plurality of samples are prepared by being coated with the resist under a plurality of conditions resulting from stepwise change in the concentration (viscosity) of the resist solution and under the condition in which said main rotation speed and said main rotation time in said uniforming step are fixed at the determined condition I of the main rotation speed and the main rotation time, and the drying rotation speed in said drying step is fixed at the determined condition IV of drying rotation speed, wherein the resist film thicknesses of each samples are measured at a plurality of points within a desirably specified effective region in said substrate, a mean value of the results of resist film thicknesses measurements is determined, the relationship is thereby determined between the concentration (viscosity) of the resist solution of each sample and the mean value of the resist film thicknesses of each sample, and this relationship is specified to be reference data C', wherein a condition V' of concentration (viscosity) of the resist solution for achieving a desirably specified resist film thickness mean is determined based on said reference data C', wherein the main rotation speed and the main rotation time are selectively fixed at the determined condition I, wherein the drying rotation speed is selectively fixes at the determined condition IV, wherein the concentration (viscosity) of the resist solution is selectively fixed at the determined condition V', and wherein resist-coating is performed in accordance with the condition I, condition IV, and condition V', wherein the film thickness uniformity within the effective region of 132 mm by 132 mm in the midsection of the substrate is not greater than 20–30 angstroms or 30–40 angstroms.

10. A mask blank according to claim 9, wherein said reference data A is a contour map in which the vertical axis indicates said main rotation speed, the horizontal axis indicates said main rotation time, and points corresponding to the same film thickness uniformity within the effective region are connected by a contour line, or is a bird's eye view drawn by point-plotting where the X axis, the Y axis and the Z axis indicate said main rotation speed, said main rotation time and said film thickness uniformity within the effective region, respectively.

11. A manufacturing method of a mask blank comprising a substrate and a resist film on said substrate, the substrate including at least an opaque layer and/or a phase-shifting layer, or phase-shifting layer having an opaque function, wherein the resist film is formed by the spin-coating method comprising:

a uniforming (evening or flatting) step of dispensing a resist solution on a substrate and rotating said substrate at a predetermined main rotation speed for a predetermined main rotation time, so as to primarily make a resist film thickness uniform; and a drying step of rotating said substrate at a predetermined drying rotation speed for a predetermined drying rotation time after said uniforming step, so as to primarily dry said uniform resist film, wherein a plurality of samples are prepared by being coated with the resist solution under a plurality of conditions resulting from independent, stepwise change in parameters in said uniforming step, the parameters being said main rotation speed and said main rotation time, and under the condition in which the concentration (viscosity) of the resist solution is fixed at an arbitrary concentration, and the drying rotation speed in said drying step is fixed at an arbitrary rotation speed, wherein the resist film thicknesses of each sample are measured at a plurality of points within a desirably specified effective region (critical area) in said substrate, film thickness uniformity within an effective region is determined from results of film thickness uniformity distribution within the effective region, the relationship is thereby determined between a condition of combination of the main rotation speed and the main rotation time of each sample and the film thickness uniformity within the effective region on each sample, and this relationship is specified to be reference data A, wherein a condition I of combination of the main rotation speed and the main rotation time for achieving desirably specified film thickness uniformity within the effective region is determined based on said reference data A, and wherein resist-coating is performed in accordance with the condition I of combination of the main rotation speed and the main rotation time.

12. A manufacturing method of a mask blank comprising a substrate and a resist film on said substrate, the substrate including at least an opaque layer and/or a phase-shifting layer, or phase-shifting layer having an opaque function, wherein the resist film is formed by the spin-coating method comprising:

a uniforming (evening or flatting) step of dispensing a resist solution on a substrate and rotating said substrate at a predetermined main rotation speed for a predetermined main rotation time, so as to primarily make the resist film thickness uniform; and a drying step of rotating said substrate at a predetermined drying rotation speed for a predetermined drying rotation time after said uniforming step, so as to primarily dry said uniform resist film, wherein a plurality of samples are prepared by being coated with the resist solution under a plurality of conditions resulting from independent, stepwise change in parameters in said uniforming step, the parameters being said main rotation speed and said main rotation time, and under the condition in which the concentration (viscosity) of the resist solution is fixed at an arbitrary concentration, and the drying rotation speed in said drying step is fixed at an arbitrary rotation speed, wherein the resist film thicknesses of each sample are measured at a plurality of points within a desirably specified effective region (critical area) in said substrate, film thickness uniformity within an effective region is determined from results of film thickness uniformity distribution within the effective region, the relationship is thereby determined between a condition of combination of the main rotation speed and the main rotation time of each sample and the film thickness uniformity within the effective region on each sample, and this relationship is specified to be reference data A, wherein a plurality of reference data A are determined based on stepwise change in the concentration (viscosity) of the resist solution, and a condition II of concentration (viscosity) of the resist solution for achieving the maximum film thickness uniformity within the effective region is determined among a group consisting of the plural reference data A, and wherein resist-coating is performed in accordance with the condition II of concentration (viscosity) of the resist solution.

13. A manufacturing method of a mask blank according to claim 12, wherein said reference data A is a contour map in which the vertical axis indicates said main rotation speed, the horizontal axis indicates said main rotation time, and points corresponding to the same film thickness uniformity within the effective region are connected by a contour line, or is a bird's eye view drawn by point-plotting where the X axis, the Y axis and the Z axis indicate said main rotation speed, said main rotation time and said film thickness uniformity within the effective region, respectively, and wherein a plurality of contour maps or bird's eye views are determined based on stepwise change in the concentration (viscosity) of the resist solution, and said condition II of concentration (viscosity) of the resist solution for achieving the maximum film thickness uniformity within the effective region is determined among a group consisting of the plural contour maps or a group consisting of the plural bird's eye views.

14. A manufacturing method of a mask blank comprising a substrate and a resist film on said substrate, the substrate including at least an opaque layer and/or a phase-shifting layer, or phase-shifting layer having an opaque function, wherein the resist film is formed by the spin-coating method comprising:

a uniforming (evening or flatting)step of dispensing a resist solution on a substrate and rotating said substrate at a predetermined main rotation speed for a predetermined main rotation time, so as to primarily make the resist film thickness uniform; and a drying step of rotating said substrate at a predetermined drying rotation speed for a predetermined drying rotation time after said uniforming step, so as to primarily dry said uniform resist film, wherein a plurality of samples are prepared by being coated with the resist solution under a plurality of conditions resulting from independent, stepwise change in parameters in said uniforming step, the parameters being said main rotation speed and said main rotation time, and under the condition in which the concentration (viscosity) of the resist solution is fixed at an arbitrary concentration, and the drying rotation speed in said drying step is fixed at an arbitrary rotation speed, wherein the resist film thicknesses of each sample are measured at a plurality of points within a desirably specified effective region (critical area) in said substrate, film thickness uniformity within an effective region is determined from results of film thickness uniformity distribution within the effective region, the relationship is thereby determined between a condition of combination of the main rotation speed and the main rotation time of each sample and the film thickness uniformity within the effective region on each sample, and this relationship is specified to be reference data A, wherein a plurality of reference data A are determined based on stepwise change in the drying rotation speed in said drying step when the concentration (viscosity) of the resist solution is fixed at an arbitrary concentration, and a condition III of drying rotation speed for achieving the maximum film thickness uniformity within the effective region is determined among a group consisting of the plural reference data, and wherein resist-coating is performed in accordance with the condition III of the drying rotation speed.

15. A manufacturing method of a mask blank according to claim 14, wherein said reference data A is a contour map in which the vertical axis indicates said main rotation speed, the horizontal axis indicates said main rotation time, and points corresponding to the same film thickness uniformity within the effective region are connected by a contour line, or is a bird's eye view drawn by point-plotting where the X axis, the Y axis and the Z axis indicate said main rotation speed, said main rotation time and said film thickness uniformity within the effective region, respectively, and wherein a plurality of contour maps or bird's eye views are determined based on stepwise change in the drying rotation speed in said drying step when the concentration (viscosity) of the resist solution is fixed at an arbitrary concentration, and said condition III of drying rotation speed for achieving the maximum film thickness uniformity within the effective region is determined among a group consisting of the contour maps or a group consisting of the bird's eye views.

16. A manufacturing method of a mask blank comprising a substrate and a resist film on said substrate, the substrate including at least an opaque layer and/or a phase-shifting layer, or phase-shifting layer having an opaque function, wherein the resist film is formed by the spin-coating method comprising:

a uniforming (evening or flatting)step of dispensing a resist solution on a substrate and rotating said substrate at a predetermined main rotation speed for a predetermined main rotation time, so as to primarily make the resist film thickness uniform; and a drying step of rotating said substrate at a predetermined drying rotation speed for a predetermined drying rotation time after said uniforming step, so as to primarily dry said uniform resist film, wherein a plurality of samples are prepared by being coated with the resist solution under a plurality of conditions resulting from independent, stepwise change in parameters in said uniforming step, the parameters being said main rotation speed and said main rotation time, and under the condition in which the concentration (viscosity) of the resist solution is fixed at an arbitrary concentration, and the drying rotation speed in said drying step is fixed at an arbitrary rotation speed, wherein the resist film thicknesses of each sample are measured at a plurality of points within a desirably specified effective region (critical area) in said substrate, film thickness uniformity within an effective region is determined from results of film thickness uniformity distribution within the effective region, the relationship is thereby determined between a condition of combination of the main rotation speed and the main rotation time of each sample and the film thickness uniformity within the effective region on each sample, and this relationship is specified to be reference data A, wherein a condition I of combination of the main rotation speed and the main rotation time for achieving desirably specified film thickness uniformity within the effective region is determined based on said reference data A, wherein a plurality of samples are prepared by being coated with the resist under a plurality of conditions resulting from stepwise change in the drying rotation speed in said drying step and under the condition in which said main rotation speed and said main rotation time in said uniforming step are fixed at the determined condition I of the main rotation speed and the main rotation time, wherein the resist film thicknesses of each sample are measured at a plurality of points within a desirably specified effective region in said substrate, film thickness uniformity within the effective region is determined from results of the film thickness uniformity distribution within the effective region, the relationship is thereby determined between the drying rotation speed of each sample and the film thickness uniformity within the effective region on each sample, and this relationship is specified to be reference data B, wherein a condition IV of drying rotation speed for achieving the maximum film thickness uniformity within the effective region is determined based on said reference data B, and wherein resist-coating is performed in accordance with the condition IV of the drying rotation speed.

17. A manufacturing method of a mask blank comprising a substrate and a resist film on said substrate, the substrate including at least an opaque layer and/or a phase-shifting layer, or phase-shifting layer having an opaque function, wherein the resist film is formed by the spin-coating method comprising:

a uniforming (evening or flatting)step of dispensing a resist solution on a substrate and rotating said substrate at a predetermined main rotation speed for a predetermined main rotation time, so as to primarily make the resist film thickness uniform; and a drying step of rotating said substrate at a predetermined drying rotation speed for a predetermined drying rotation time after said uniforming step, so as to primarily dry said uniform resist film, wherein a plurality of samples are prepared by being coated with the resist solution under a plurality of conditions resulting from independent, stepwise change in parameters in said uniforming step, the parameters being said main rotation speed and said main rotation time, and under the condition in which the concentration (viscosity) of the resist solution is fixed at an arbitrary concentration, and the drying rotation speed in said drying step is fixed at an arbitrary rotation speed, wherein the resist film thicknesses of each sample are measured at a plurality of points within a desirably specified effective region (critical area) in said substrate, film thickness uniformity within an effective region is determined from results of film thickness uniformity distribution within the effective region, the relationship is thereby determined between a condition of combination of the main rotation speed and the main rotation time of each sample and the film thickness uniformity within the effective region on each sample, and this relationship is specified to be reference data A, wherein a condition I of combination of the main rotation speed and the main rotation time for achieving desirably specified film thickness uniformity within the effective region is determined based on said reference data A, wherein a plurality of samples are prepared by being coated with the resist under a plurality of conditions resulting from stepwise change in the concentration (viscosity) of the resist solution and under the condition in which said main rotation speed and said main rotation time in said uniforming step are fixed at the determined condition I, wherein the resist film thicknesses of each sample are measured at a plurality of points within a desirably specified effective region in said substrate, a mean value of results of resist film thicknesses measurements is determined, the relationship is thereby determined between the concentration (viscosity) of the resist solution of each sample and the mean value of the resist film thicknesses of each sample, and this relationship is specified to be reference data C, wherein a condition V of concentration (viscosity) of the resist solution for achieving a desirably specified resist film thickness mean is determined based on said reference data C, and wherein resist-coating is performed in accordance with the condition V of concentration (viscosity) of the resist solution.

18. A manufacturing method of a mask blank comprising a substrate and a resist film on said substrate, the substrate including at least an opaque layer and/or a phase-shifting layer, or phase-shifting layer having an opaque function, wherein the resist film is formed by the spin-coating method comprising:

a uniforming (evening or flatting) step of dispensing a resist solution ort a substrate and rotating said substrate at a predetermined main rotation speed for a predetermined main rotation time, so as to primarily make a resist film thickness uniform; and a drying step of rotating said substrate at a predetermined drying rotation speed for a predetermined drying rotation time after said uniforming step, so as to primarily dry said uniform resist film, wherein a plurality of samples are prepared by being coated with the resist solution under a plurality of conditions resulting from independent, stepwise change in parameters in said uniforming step, the parameters being said main rotation speed and said main rotation time, and under the condition in which the concentration (viscosity) of the resist solution is fixed at an arbitrary concentration, and the drying rotation speed in said drying step is fixed at an arbitrary rotation speed, wherein the resist film thicknesses of each sample are measured at a plurality of points within a desirably specified effective region (critical area) in said substrate, film thickness uniformity within an effective region is determined from results of film thickness uniformity distribution within the effective region, the relationship is thereby determined between a condition of combination of the main rotation speed and the main rotation time of each sample and the film thickness uniformity within the effective region on each sample, and this relationship is specified to be reference data A, wherein a condition I of combination of the main rotation speed and the main rotation time for achieving desirably specified film thickness uniformity within the effective region is determined based on said reference data A, wherein a plurality of samples are prepared by being coated with the resist under a plurality of conditions resulting from stepwise change in the drying rotation speed in said drying step and under the condition in which said main rotation speed and said main rotation time in said uniforming step are fixed at the determined condition I of the main rotation speed and the main rotation time, wherein the resist film thicknesses of each sample are measured at a plurality of points within a desirably specified effective region in said substrate, film thickness uniformity within the effective region is determined from results of the film thickness uniformity distribution within the effective region, the relationship is thereby determined between the drying rotation speed of each sample and the film thickness uniformity within the effective region on each sample, and this relationship is specified to be reference data B, wherein a condition IV of drying rotation speed for achieving the maximum film thickness uniformity within the effective region is determined based on said reference data B, wherein a plurality of samples are prepared by being coated with the resist under a plurality of conditions resulting from stepwise change in the concentration (viscosity) of the resist solution and under the condition in which said main rotation speed and said main rotation time in said uniforming step are fixed at the determined condition I of the main rotation speed and the main rotation time, and the drying rotation speed in said drying step is fixed at the condition IV of drying rotation speed, wherein the resist film thicknesses of each samples are measured at a plurality of points within a desirably specified effective region in said substrate, a mean value of the results of resist film thicknesses measurements is determined, the relationship is thereby determined between the concentration (viscosity) of the resist solution of each sample and the mean value of the resist film thicknesses of each sample, and this relationship is specified to be reference data C', wherein a condition V' of concentration (viscosity) of the resist solution for achieving a desirably specified resist film thickness mean is determined based on said reference data C', and wherein resist-coating is performed in accordance with the condition V' of concentration (viscosity) of the resist solution.

19. A manufacturing method of a mask blank comprising a substrate and a resist film on said substrate, the substrate including at least an opaque layer and/or a phase-shifting layer, or phase-shifting layer having an opaque function, wherein the resist film is formed by the spin-coating method comprising:

a uniforming (evening or flatting) step of dispensing a resist solution ort a substrate and rotating said substrate at a predetermined main rotation speed for a predetermined main rotation time, so as to primarily make a resist film thickness uniform; and a drying step of rotating said substrate at a predetermined drying rotation speed for a predetermined drying rotation time after said uniforming step, so as to primarily dry said uniform resist film, wherein a plurality of samples are prepared by being coated with the resist solution under a plurality of conditions resulting from independent, stepwise change in parameters in said uniforming step, the parameters being said main rotation speed and said main rotation time, and under the condition in which the concentration (viscosity) of the resist solution is fixed at an arbitrary concentration, and the drying rotation speed in said drying step is fixed at an arbitrary rotation speed, wherein the resist film thicknesses of each sample are measured at a plurality of points within a desirably specified effective region (critical area) in said substrate, film thickness uniformity within an effective region is determined from results of film thickness uniformity distribution within the effective region, the relationship is thereby determined between a condition of combination of the main rotation speed and the main rotation time of each sample and the film thickness uniformity within the effective region on each sample, and this relationship is specified to be reference data A, wherein a condition I of combination of the main rotation speed and the main rotation time for achieving desirably specified film thickness uniformity within the effective region is determined based on said reference data A, wherein a plurality of samples are prepared by being coated with the resist under a plurality of conditions resulting from stepwise change in the drying rotation speed in said drying step and under the condition in which said main rotation speed and said main rotation time in said uniforming step are fixed at the determined condition I of the main rotation speed and the main rotation time, wherein the resist film thicknesses of each sample are measured at a plurality of points within a desirably specified effective region in said substrate, film thickness uniformity within the effective region is determined from results of the film thickness uniformity distribution within the effective region, the relationship is thereby determined between the drying rotation speed of each sample and the film thickness uniformity within the effective region on each sample, and this relationship is specified to be reference data B, wherein a condition IV of drying rotation speed for achieving the maximum film thickness uniformity within the effective region is determined based on said reference data B, wherein a plurality of samples are prepared by being coated with the resist under a plurality of conditions resulting from stepwise change in the concentration (viscosity) of the resist solution and under the condition in which said main rotation speed and said main rotation time in said uniforming step are fixed at the determined condition I of the main rotation speed and the main rotation time, and the drying rotation speed in said drying step is fixed at the determined condition IV of drying rotation speed, wherein the resist film thicknesses of each samples are measured at a plurality of points within a desirably specified effective region in said substrate, a mean value of the results of resist film thicknesses measurements is determined, the relationship is thereby determined between the concentration (viscosity) of the resist solution of each sample and the mean value of the resist film thicknesses of each sample, and this relationship is specified to be reference data C', wherein a condition V' of concentration (viscosity) of the resist solution for achieving a desirably specified resist film thickness mean is determined based on said reference data C', wherein the main rotation speed and the main rotation time are selectively fixed at the determined condition I, wherein the drying rotation speed is selectively fixes at the determined condition IV, wherein the concentration (viscosity) of the resist solution is selectively fixed at the determined condition V', and wherein resist-coating is performed in accordance with the condition I, condition IV, and condition V'.

20. A manufacturing method of a mask blank according to claim 19, wherein said reference data A is a contour map in which the vertical axis indicates said main rotation speed, the horizontal axis indicates said main rotation time, and points corresponding to the same film thickness uniformity within the effective region are connected by a contour line, or is a bird's eye view drawn by point-plotting where the X axis, the Y axis and the Z axis indicate said main rotation speed, said main rotation time and said film thickness uniformity within the effective region, respectively.

* * * * *